(12) United States Patent
Kanai

(10) Patent No.: US 8,118,457 B2
(45) Date of Patent: Feb. 21, 2012

(54) ILLUMINATING DEVICE

(75) Inventor: Norifumi Kanai, Osaka (JP)

(73) Assignee: Nalux Co., Ltd., Osaka (JP)

( * ) Notice: Subject to any disclaimer, the term of this patent is extended or adjusted under 35 U.S.C. 154(b) by 0 days.

(21) Appl. No.: 12/973,177

(22) Filed: Dec. 20, 2010

(65) Prior Publication Data

US 2011/0157898 A1 Jun. 30, 2011

Related U.S. Application Data

(63) Continuation of application No. PCT/JP2010/002625, filed on Apr. 9, 2010.

(60) Provisional application No. 61/257,959, filed on Nov. 4, 2009, provisional application No. 61/292,950, filed on Jan. 7, 2010.

(51) Int. Cl.
*F21V 17/02* (2006.01)

(52) U.S. Cl. .................... 362/327; 362/335; 362/338

(58) Field of Classification Search .................. 362/245, 362/307–310, 311.01, 311.02, 326, 334, 362/335, 339, 555, 612, 613, 800
See application file for complete search history.

(56) References Cited

U.S. PATENT DOCUMENTS

| | | | | |
|---|---|---|---|---|
| 2,254,961 A | * | 9/1941 | Harris | 362/327 |
| 2,362,176 A | * | 11/1944 | Swanson | 313/110 |
| 6,543,911 B1 | | 4/2003 | Rizkin et al. | |
| 6,598,998 B2 | * | 7/2003 | West et al. | 362/307 |
| 6,679,621 B2 | * | 1/2004 | West et al. | 362/327 |
| 6,899,443 B2 | | 5/2005 | Rizkin et al. | |
| 7,034,343 B1 | * | 4/2006 | Kim et al. | 257/98 |
| 7,083,313 B2 | * | 8/2006 | Smith | 362/555 |
| 7,142,769 B2 | * | 11/2006 | Hsieh et al. | 385/146 |
| 7,254,309 B1 | * | 8/2007 | Chou et al. | 385/146 |
| 7,322,721 B2 | * | 1/2008 | Noh et al. | 362/327 |
| 7,329,029 B2 | * | 2/2008 | Chaves et al. | 362/329 |
| 7,347,590 B2 | * | 3/2008 | Lee et al. | 362/327 |
| 7,433,134 B2 | * | 10/2008 | Chou et al. | 359/726 |
| 7,438,445 B2 | * | 10/2008 | Shiau et al. | 362/333 |
| 7,454,119 B2 | * | 11/2008 | Hsieh et al. | 385/146 |
| 7,524,098 B2 | * | 4/2009 | Vennetier et al. | 362/555 |

(Continued)

FOREIGN PATENT DOCUMENTS

JP 6-26270 4/1994

(Continued)

*Primary Examiner* — Hargobind S Sawhney
(74) *Attorney, Agent, or Firm* — Squire Sanders (US) LLP

(57) ABSTRACT

An illuminating device includes a light source and a light receiving surface, first and second light exit surfaces. When a point at the edge of the light emitting surface is P2 and an axis which passes through a center P1 of a light emitting surface and is perpendicular to the light emitting surface is an optical axis, the optical element has a hollow around the optical axis. The first light exit surface is such that x coordinate of a point most distant from the optical axis on the first light exit surface is at least 1.5 times x coordinate of P2, that in 80% or more of an area in which x coordinate of a point is at least the x coordinate of another point P3, an angle of incidence of light emitted at P1 is at least the critical angle and that in 80% or more of an area in which x coordinate of a point is equal to or smaller than x coordinate of another point P4, an angle of incidence of light emitted at P2 is smaller than the critical angle.

19 Claims, 25 Drawing Sheets

U.S. PATENT DOCUMENTS

| | | | |
|---|---|---|---|
| 7,540,635 B2 * | 6/2009 | Kim et al. | 362/327 |
| 7,543,965 B2 * | 6/2009 | Noh et al. | 362/307 |
| 7,566,148 B2 * | 7/2009 | Noh et al. | 362/305 |
| 7,637,647 B2 * | 12/2009 | Chen | 362/613 |
| 7,959,328 B2 * | 6/2011 | Wanninger | 362/309 |

FOREIGN PATENT DOCUMENTS

| | | |
|---|---|---|
| JP | 2008-226702 | 9/2008 |
| JP | 2009-021086 | 1/2009 |

* cited by examiner (a)

(b)

(c)

251

ILLUMINATING DEVICE

FIELD OF THE INVENTION

The present invention relates to an illuminating device using a surface light source.

BACKGROUND ART

Light emitting diodes (LED) have recently been used for illuminating devices as LED light bulbs in place of conventional incandescent light bulbs because of their lower energy consumption. LED light bulbs are required to have a light distribution property similar to that of conventional incandescent light bulbs.

However, blue LED chips have an emitted-light distribution property of close to Lambertian, and therefore a white LED or a bulb-color LED light source using blue LED chips with fluorescent substances also have a light distribution property close to Lambertian. Lambertian means a distribution of emitted light in which intensity of the emitted light is proportional to the cosine of the observation angle. Accordingly, with light sources using LEDs, radiation to areas at the rear of the light source, that is, radiation with a solid angle of $2\pi$ or more cannot be realized, and intensity of light toward the front of the light emitting surface becomes strong. Under the situation, methods for radiating sufficient amount of light omnidirectionally with solid angles of $2\pi$ or more can be roughly divided into two groups. The first is a method in which LED chips are arranged three-dimensionally in each direction. However, in this method manufacturing cost is high and there exist problems concerning thermal design of LEDs. The second is a method an optical element is arranged in front of the light source to control directions of rays. However, there has not existed an optical element by which an ideal light distribution can be efficiently realized.

On the other hand, illuminating devices in which paths of rays emitted from the light source are changed by an optical element have conventionally been developed. Such conventional illuminating devices are those using a point light (as shown in Patent Documents 1 and 2, for example) or those using a surface light source and an optical element which is large enough with respect to a size of the light source and which is used to illuminate light in a certain direction by setting the focal length to a value as large as possible for higher degree of collimation (as shown in Patent Document 3, for example).

Further, in general, control of directions of rays for other purposes than collimation (for example, for dispersion of rays) becomes easier as a size of the optical element with respect to that of the light source increases. The reason is that as a distance of an optical surface of the optical element from the light source increases, incident directions of rays to various positions on the optical surface become more uniform, and therefore the rays can be controlled more freely. In contrast, when a size of the optical element is similar to that of the light source, an optical surface of the optical element is close to the light source. As a result, incident directions of rays to various positions on the optical surface are not uniform, and therefore the rays can hardly be controlled freely.

Thus, a compact illuminating device in which an optical element is used to distribute light emitted by a surface light source such as an LED to illuminate sufficient amount of light omnidirectionally with solid angles of $2\pi$ or more has not been developed.

PATENT DOCUMENTS

Patent document 1: U.S. Pat. No. 6,543,911B1
Patent document 2: U.S. Pat. No. 6,899,443B2
Patent document 3: JP2008-226702A So, there is a need for a compact illuminating device in which an optical element is used to distribute light emitted by a surface light source such as an LED to illuminate ominidirectionally with solid angles of $2\pi$ or more.

SUMMARY OF THE INVENTION

An illuminating device according to one aspect of the present invention includes a light source and an optical element including a light receiving surface faced to a light emitting surface of the light source, a first light exit surface located opposite to the end of the optical element from the light receiving surface and a second light exit surface connecting the light receiving surface and the first light exit surface. When the center of the light emitting surface is designated as a first point, a point at the edge of the light emitting surface is designated as a second point and an axis which passes through the first point and is perpendicular to the light emitting surface is designated as an optical axis, the first light exit surface of the optical element has a hollow around the optical axis with respect to the edge and in a cross section of the optical element including the optical axis and the second point, when a point on the first exit surface at which angle of view from the first point with respect to the optical axis is 15 degrees is designated as a third point, an intersection of a ray which has been emitted at the second point and travels in parallel to the optical axis and the first light exit surface is designated as a fourth point, the first point is designated as the origin and an axis connecting the first point and the second point is designated as x axis, the first light exit surface is formed in such a way that x coordinate of a point which is the most distant from the optical axis on the first light exit surface is 1.5 times or more than x coordinate of the second point, that in 80% or more of an area in which x coordinate of a point is equal to or greater than x coordinate of the third point, an angle of incidence of light emitted at the first point is equal to or greater than the critical angle and that in 80% or more of an area in which x coordinate of a point is equal to or smaller than x coordinate of the fourth point, an angle of incidence of light emitted at the second point is smaller than the critical angle.

In the present aspect, a size of the first light exit surface in x axis direction is 1.5 times or more than that of the light emitting surface in x axis direction. Most of light which has been emitted at the first point and reaches an area in which x coordinate of a point is equal to or greater than x coordinate of the third point undergoes total internal reflection. Most of light which has been emitted at the second point and reaches an area in which x coordinate of a point is equal to or smaller than x coordinate of the fourth point undergoes refraction. For light which has been emitted at a point between the first point P1 and the second point P2 on the light emitting surface, a ratio between an amount of light which undergoes total internal reflection on the first light exit surface and that of light which undergoes refraction at the first light exit surface is determined according to x coordinate of the point. In general, as x coordinate of a point at which light is emitted approaches that of the first point, the ratio of an amount of light which undergoes total internal reflection increases while as x coordinate of a point at which light is emitted approaches that of the second point, the ratio of an amount of light which undergoes refraction increases. Accordingly, for light which has been emitted at various points on the light emitting surface, a ratio between an amount of light which undergoes total internal reflection on the first light exit surface and that of light which undergoes refraction at the first light exit surface can be appropriately determined by forming the first light exit surface as described above.

In the text of specification and claims, a point at the edge of the light emitting surface means the point on the light emitting surface which is the most distant from the optical axis in a cross section of the optical element including the optical axis.

Thus, the present invention is based on new findings that a compact illuminating device for illumination at a solid angle of $2\pi$ or more can be obtained by appropriately determining a shape of a light exit surface in consideration of paths of light emitted at the first and second points and by appropriately determining a ratio of a size of the optical element in x axis direction to that of the surface light source in x axis direction.

An illuminating device according to another aspect of the present invention includes a light source and an optical element including a light receiving surface faced to a light emitting surface of the light source, a first light exit surface located opposite to the end of the optical element from the light receiving surface and a second light exit surface connecting the light receiving surface and the first light exit surface. When the center of the light emitting surface is designated as a first point, a point at the edge of the light emitting surface is designated as a second point and an axis which passes through the first point and is perpendicular to the light emitting surface is designated as an optical axis, the first light exit surface of the optical element has a hollow around the optical axis with respect to the edge and in a cross section of the optical element including the optical axis and the second point, in an area at which angle of view from the first point with respect to the optical axis is from 25 degrees to 60 degrees, the first light exit surface has an area inclination of which is equal to or less than 20 degrees with respect to a straight line connecting the first point and the second point and when a point on the first exit surface at which angle of view from the first point with respect to the optical axis is 15 degrees is designated as a third point, an intersection of a ray which has been emitted at the second point and travels in parallel to the optical axis and the first light exit surface is designated as a fourth point, angle of incidence to the first light exit surface of a ray which has been emitted at the first point and reaches the third point is designated as $\theta_{13}$, angle of incidence to the first light exit surface of a ray which has been emitted at the second point and reaches the third point is designated as $\theta_{23}$, angle of incidence to the first light exit surface of a ray which has been emitted at the first point and reaches the fourth point is designated as $\theta_{14}$, angle of incidence to the first light exit surface of a ray which has been emitted at the second point and reaches the fourth point is designated as $\theta_{24}$, and the critical angle is designated as $\theta_c$, the following conditions are satisfied.

$$15° \leq \theta_{13} - \theta_{23} \leq 70° \quad (1)$$

$$15° \leq \theta_{14} - \theta_{24} \leq 65° \quad (2)$$

$$0.2 \leq (\theta_{14} - \theta_{24})/(\theta_{13} - \theta_{23}) \leq 1 \quad (3)$$

When the conditions represented by Expressions (1) to (3), a ratio between an amount of light which undergoes total internal reflection on the first light exit surface and that of light which undergoes refraction at the first light exit surface can be appropriately determined and uniform illumination not only in the forward direction but also in the lateral directions and in the backward direction can be realized.

In an embodiment of the present invention, the following conditions are further satisfied.

$$\theta_c \leq \theta_{13} \quad (4)$$

$$\theta_{23} \leq \theta_c \quad (5)$$

According to the present embodiment, a ratio between an amount of light which undergoes total internal reflection on the first light exit surface and that of light which undergoes refraction at the first light exit surface can be more appropriately determined.

In another embodiment of the present invention, in the cross section of the optical element including the optical axis and the second point, when an axis connecting the first point and the second point is designated as x axis, the first light exit surface is formed in such a way that all of light emitted at the first point undergoes total internal reflection in an area in which x coordinate of a point is equal to or greater than x coordinate of the third point.

According to the present embodiment, more uniform illumination not only in the forward direction but also in the lateral directions and in the backward direction can be realized.

In another embodiment of the present invention, in the cross section of the optical element including the optical axis and the second point, when an axis connecting the first point and the second point is designated as x axis, an area between the third point and the fourth point in x axis direction of the first light exit surface is formed in such a way that all of light emitted at the second point undergoes refraction.

According to the present embodiment, more uniform illumination not only in the forward direction but also in the lateral directions and in the backward direction can be realized.

In another embodiment of the present invention, in the cross section of the optical element including the optical axis and the second point, when an axis connecting the first point and the second point is designated as x axis, an area between the third point and the fourth point in x axis direction of the first light exit surface is on the other side of a straight line connecting the third point and the fourth point from the light source.

According to the present embodiment, more uniform illumination not only in the forward direction but also in the lateral directions and in the backward direction can be realized.

In another embodiment of the present invention, when an area of the light emitting surface is designated A and an area of the first light exit surface is designated as B, the following condition is satisfied.

$$3 \leq B/A \leq 60 \quad (6)$$

According to the present embodiment, more uniform illumination not only in the forward direction but also in the lateral directions and in the backward direction can be realized.

In another embodiment of the present invention, when an area of the light emitting surface is designated A and a projected area of the first light exit surface onto a plane of the light source is designated as C, the following condition is satisfied.

$$1 \leq C/A \leq 20 \quad (7)$$

According to the present embodiment, more uniform illumination not only in the forward direction but also in the lateral directions and in the backward direction can be realized.

In another embodiment of the present invention, when an area of the light emitting surface is designated A and a height of the optical element is designated as D, the following condition is satisfied.

$$1 \leq D/\sqrt{A/\pi} \leq 10 \tag{8}$$

According to the present embodiment, more uniform illumination not only in the forward direction but also in the lateral directions and in the backward direction can be realized.

In another embodiment of the present invention, when an area of the light emitting surface is designated A and a depth of the hollow on the first light exit surface is designated as E, the following condition is satisfied.

$$0.25 \leq E/\sqrt{A/\pi} \leq 4 \tag{9}$$

According to the present embodiment, more uniform illumination not only in the forward direction but also in the lateral directions and in the backward direction can be realized.

In another embodiment of the present invention, the first light exit surface has a projection for diffusing light in an area which is closer to the optical axis than the third point.

According to the present embodiment, rays collecting around the optical axis can be diffused.

In another embodiment of the present invention, the light emitting surface and the light receiving surface are separated by an amount of clearance.

According to the present embodiment, refraction at the light receiving surface can be utilized for more flexible control of rays.

In another embodiment of the present invention, when an area of the light emitting surface is designated A and clearance between the light emitting surface and the light receiving surface of the optical element is F, the following condition is satisfied.

$$0 < F/\sqrt{A/\pi} \leq 0.2 \tag{10}$$

According to the present embodiment, a ratio of an amount of light which is received by the light receiving surface can be maximized.

In another embodiment of the present invention, in the cross section of the optical element including the optical axis and the second point, when an axis connecting the first point and the second point is designated as x axis, a derivative of the first light exit surface with respect to x is continuous.

According to the present embodiment, unevenness of rays can be reduced.

In another embodiment of the present invention, at least a portion of the first light exit surface and the second light exit surface is provided with microscopic asperities.

According to the present embodiment, more uniform illumination can be realized.

In another embodiment of the present invention, in the cross section of the optical element including the optical axis and the second point, the second light exit surface has a straight-line segment.

In the optical element of the illuminating device according to the present embodiment, unevenness of rays which tends to show up around the boundary between the first light exit surface and the second light exit surface can be reduced.

In another embodiment of the present invention, the optical element is provided with an optical surface for diffusing light around the boundary between the first light exit surface and the second light exit surface.

According to the present embodiment, unevenness of rays which tends to show up around the boundary between the first light exit surface and the second light exit surface can be reduced.

In another embodiment of the present invention, the optical surface for diffusing light has a concave shape with a constant radius of curvature R, and when an area of the light emitting surface is designated as A, the following condition is satisfied.

$$R/\sqrt{A/\pi} \leq 0.5 \tag{11}$$

The optical surface for diffusing light of the illuminating device according to the present embodiment has a sufficient light-diffusing function.

In another embodiment of the present invention, the optical element is provided with a light guiding section sticking out around the boundary between the first light exit surface and the second light exit surface.

According to the present embodiment, the light guiding section serves to reduce unevenness of rays which tends to show up around the boundary between the first light exit surface and the second light exit surface.

An illuminating device according to another embodiment of the present invention includes a cover which covers the light source and the optical element wherein the cover is connected to the optical element through the light guiding section.

According to the present embodiment, an illuminating device can be obtained, in which problems of heat from the light source have been solved while reducing unevenness of rays which tends to show up around the boundary between the first light exit surface and the second light exit surface.

In another embodiment of the present invention, the optical element is of infinite-fold rotational symmetry around the optical axis.

According to the present embodiment, in a cross section perpendicular to the optical axis, uniform illumination can be carried out in circumferential direction around the optical axis In another embodiment of the present invention, a sector of 180° or less which is cut from the shape of rotational symmetry around the optical axis is utilized.

According to the present embodiment, an illuminating device with a shape which is more appropriate for a specific application can be obtained.

In another embodiment of the present invention, cutting surfaces of the sector from the shape are curved surfaces.

According to the present embodiment, an illuminating device with a shape which is more appropriate for a specific application can be obtained.

In another embodiment of the present invention, a shape of a cross section of the optical element perpendicular to the optical axis is not uniform in circumferential direction so as to carry out non-uniform illumination in circumferential direction around the optical axis.

According to the present embodiment, in a cross section perpendicular to the optical axis, non-uniform illumination in circumferential direction around the optical axis can be carried out.

An illuminating device according to another aspect of the present invention includes a light source and an optical element including a light receiving surface faced to a light emitting surface of the light source, a first light exit surface located opposite to the end of the optical element from the light receiving surface and a second light exit surface connecting the light receiving surface and the first light exit surface. Some of rays emitted in directions deviated from the direction perpendicular to the light emitting surface are led by total internal reflection on an area close to the light receiving surface of the second light exit surface in such a way that a virtual light emitting surface is formed in the optical element, a distance of which from the light emitting surface is H and which has a shape which is identical with that formed by projecting the light emitting surface onto a plane parallel to the light emitting surface. When an area of the light emitting surface is designated as A, H should be determined such that the following condition is satisfied and that rays with an angle of view of 15 degrees with respect to the optical axis passing thorough the center of the virtual light emitting surface exist.

$$2 \leq H\sqrt{A/\pi} \leq 15 \tag{12}$$

When the center of the virtual light emitting surface is designated as a first point, a point at the edge of the virtual light emitting surface is designated as a second point and an axis which passes through the first point and is perpendicular to the light emitting surface is designated as an optical axis, the first light exit surface of the optical element has a hollow around the optical axis with respect to the edge and in a cross section of the optical element including the optical axis and the second point, when a point on the first exit surface at which angle of view from the first point with respect to the optical axis is 15 degrees is designated as a third point, an intersection of a ray which has been emitted at the second point and travels in parallel to the optical axis and the first light exit surface is designated as a fourth point, the first point is designated as the origin and an axis connecting the first point and the second point is designated as x axis, the first light exit surface is formed in such a way that x coordinate of a point which is the most distant from the optical axis on the first light exit surface is 1.5 times or more than x coordinate of the second point, that in 80% or more of an area in which x coordinate of a point is equal to or greater than x coordinate of the third point, an angle of incidence of light emitted at the first point is equal to or greater than the critical angle and that in 80% or more of an area in which x coordinate of a point is equal to or smaller than x coordinate of the fourth point, an angle of incidence of light emitted at the second point is smaller than the critical angle.

According to the illuminating device of the present aspect, rays can be directed in the backward direction at a high position which is away from the light source and therefore much light can be led toward the rear of the light source.

An illuminating device according to another aspect of the present invention includes a light source and an optical element including a light receiving surface faced to a light emitting surface of the light source, a first light exit surface located opposite to the end of the optical element from the light receiving surface and a second light exit surface connecting the light receiving surface and the first light exit surface. Some of rays emitted in directions deviated from the direction perpendicular to the light emitting surface are led by total internal reflection on an area close to the light receiving surface of the second light exit surface in such a way that a virtual light emitting surface is formed in the optical element, a distance of which from the light emitting surface is H and which has a shape which is identical with that formed by projecting the light emitting surface onto a plane parallel to the light emitting surface. When an area of the light emitting surface is designated as A, H should be determined such that the following condition is satisfied and that rays with an angle of view of 15 degrees with respect to the optical axis passing thorough the center of the virtual light emitting surface exist.

$$2 \leq H\sqrt{A/\pi} \leq 15 \tag{12}$$

When the center of the virtual light emitting surface is designated as a first point, a point at the edge of the virtual light emitting surface is designated as a second point and an axis which passes through the first point and is perpendicular to the light emitting surface is designated as an optical axis, the first light exit surface of the optical element has a hollow around the optical axis with respect to the edge and in a cross section of the optical element including the optical axis and the second point, in an area at which angle of view from the first point with respect to the optical axis is from 25 degrees to 60 degrees, the first light exit surface has an area inclination of which is equal to or less than 20 degrees with respect to a straight line connecting the first point and the second point and when a point on the first exit surface at which angle of view from the first point with respect to the optical axis is 15 degrees is designated as a third point, an intersection of a ray which has been emitted at the second point and travels in parallel to the optical axis and the first light exit surface is designated as a fourth point, angle of incidence to the first light exit surface of a ray which has been emitted at the first point and reaches the third point is designated as $\theta_{13}$, angle of incidence to the first light exit surface of a ray which has been emitted at the second point and reaches the third point is designated as $\theta_{23}$, angle of incidence to the first light exit surface of a ray which has been emitted at the first point and reaches the fourth point is designated as $\theta_{14}$, angle of incidence to the first light exit surface of a ray which has been emitted at the second point and reaches the fourth point is designated as $\theta_{24}$, and the critical angle is designated as $\theta_c$, the following conditions are satisfied.

$$15° \leq \theta_{13} - \theta_{23} \leq 70° \tag{1}$$

$$15° \leq \theta_{14} - \theta_{24} \leq 65° \tag{2}$$

$$0.2 \leq (\theta_{14} - \theta_{24})/(\theta_{13} - \theta_{23}) \leq 1 \tag{3}$$

According to the illuminating device of the present aspect, rays can be directed in the backward direction at a high position which is away from the light source and therefore much light can be led toward the rear of the light source.

MODE FOR CARRYING OUT THE INVENTION

Figure 1:
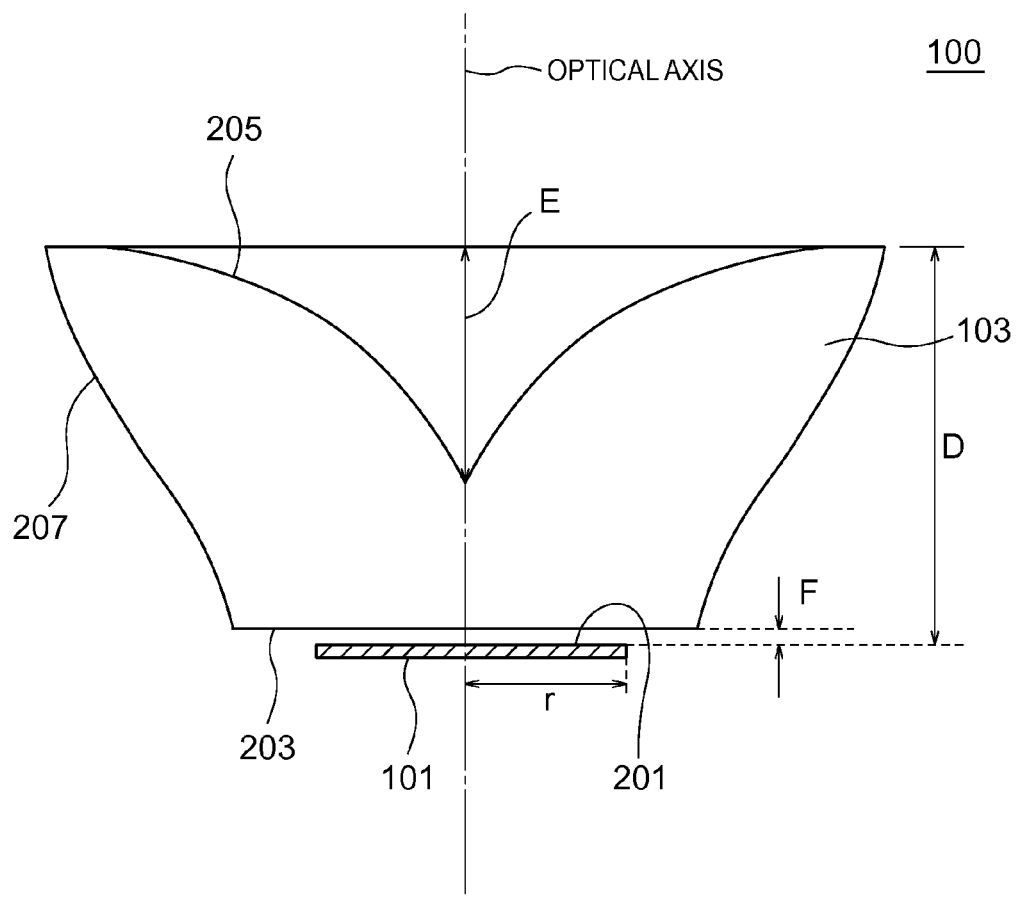
FIG. 1 shows a configuration of an illuminating device according to an embodiment of the present invention.

FIG. 1 shows a configuration of an illuminating device according to an embodiment of the present invention. The illuminating device according to the present embodiment includes a surface light source 101 and an optical element 103. The surface light source 101 may be a single chip of planar LED (Light Emitting Device), planar LED chips arranged on a surface, OLED (Organic Light Emitting Diode) and LEP (Light Emitting Polymer). The surface light source 101 may be circular. When LED chips are arranged on a surface, the surface may have a curvature. Further, the surface light source 101 may be an array of LED chips sealed by a transparent material (for example, silicone resin) of semispherical shape. The optical element 103 may have a shape of infinite-fold rotational symmetry around the axis passing through the center of the circle of the surface light source 101 and normal to the surface of the surface light source 101. The axis is referred to as an optical axis.

A light receiving surface 203 of the optical element 103 is facing a light emitting surface 201 of the surface light source 101. The optical element 103 further includes a first light exit surface 205 opposite to the end of the optical element from the light receiving surface 203 and a second light exit surface 207 connecting the light receiving surface 203 and the first light exit surface 205 and forming a side surface. The first light exit surface 205 has a hollow around the optical axis with respect to the edge. A shape of the first light exit surface 205 will be described in detail later.

A light emitting area of the surface light source 101 is represented as A. The light emitting area refers to an area of a place on which a plurality of LED chips are arranged when the surface light source 101 includes an array of a plurality of LED chips. Further, when a LED chip is sealed by a fluorescent body or the like, the light emitting area refers to an area of a place through which rays substantially pass. In the present embodiment, the surface light source 101 has a circular light emitting area having a radius of r and an area of $A(=\pi r^2)$.

A sum of an area of the first light exit surface 205 and that of the second light exit surface 207 is represented by B. Further, a projected area of the first light exit surface 205 onto a plane parallel to the surface light source 101 is represented as C.

A distance in the optical axis direction from the surface including the light emitting surface 201 to the point on the first light exit surface 205 which is the most distant from the surface including the light emitting surface 201 is represented as D.

A depth of the hollow on the first light exit surface 205 is represented as E. In FIG. 1, the depth of the hollow E is a distance in the optical axis direction between the highest point and the lowest point on the first light exit surface 205.

A distance between the light emitting surface 201 and the light receiving surface 203 is represented as F.

Figure 2A:
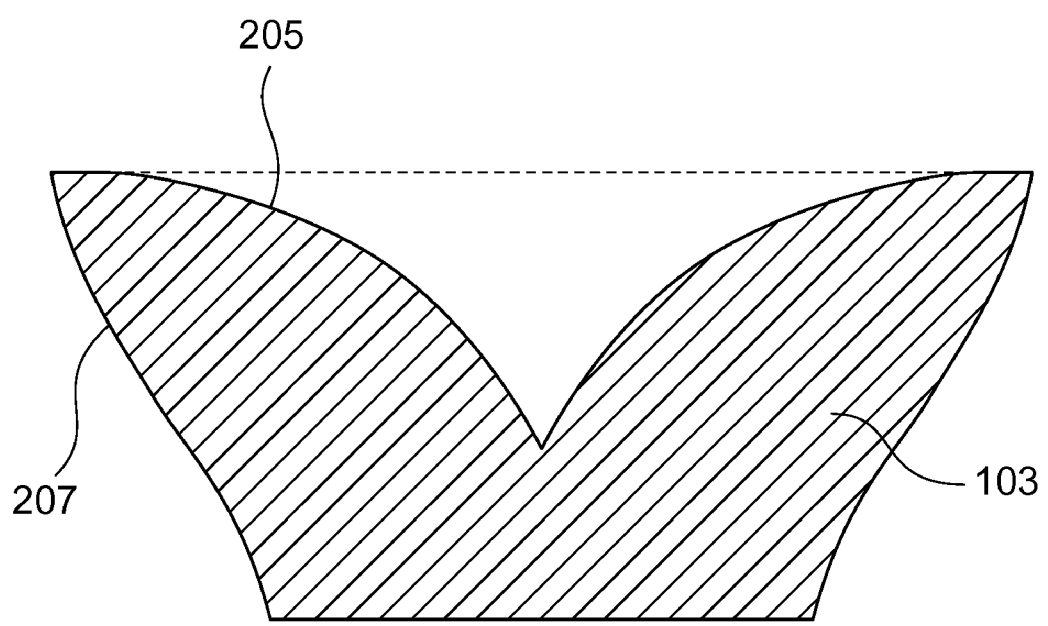
FIG. 2A shows a cross section including the optical axis of the optical element according to the present embodiment.

FIG. 2A shows a cross section including the optical axis of the optical element 103 according to the present embodiment.

Figure 2B:
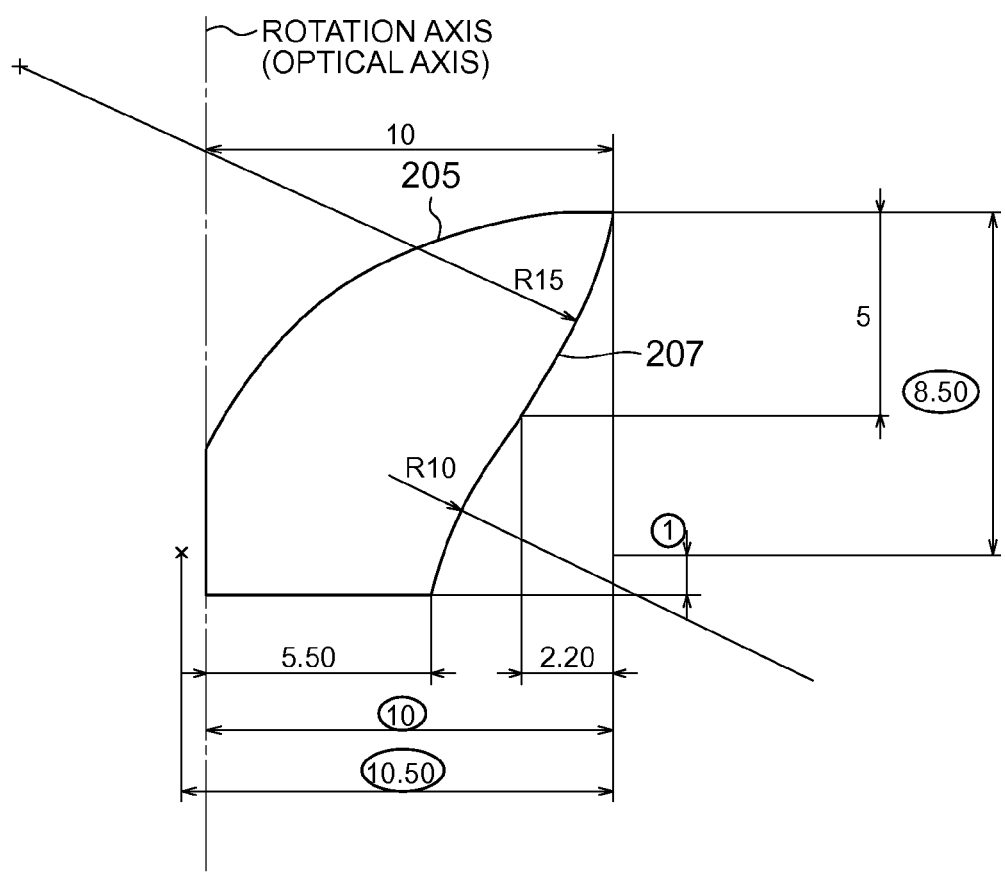
FIG. 2B shows a shape of a figure which is rotated around the rotation axis (optical axis) to obtain a rotationally symmetric body, a cross section of which is shown in FIG. 2A.

FIG. 2B shows a shape of a figure to rotate around the rotation axis (optical axis), to obtain a cross section of a rotationally symmetric body shown in FIG. 2A. Unit of numerical values in FIG. 2B is millimeter. Figures in circles in FIG. 2B define an elliptic shape of a cross section of the first light exit surface 205. In general, a cross section of the first light exit surface 205 need not be elliptic.

Figure 2C:
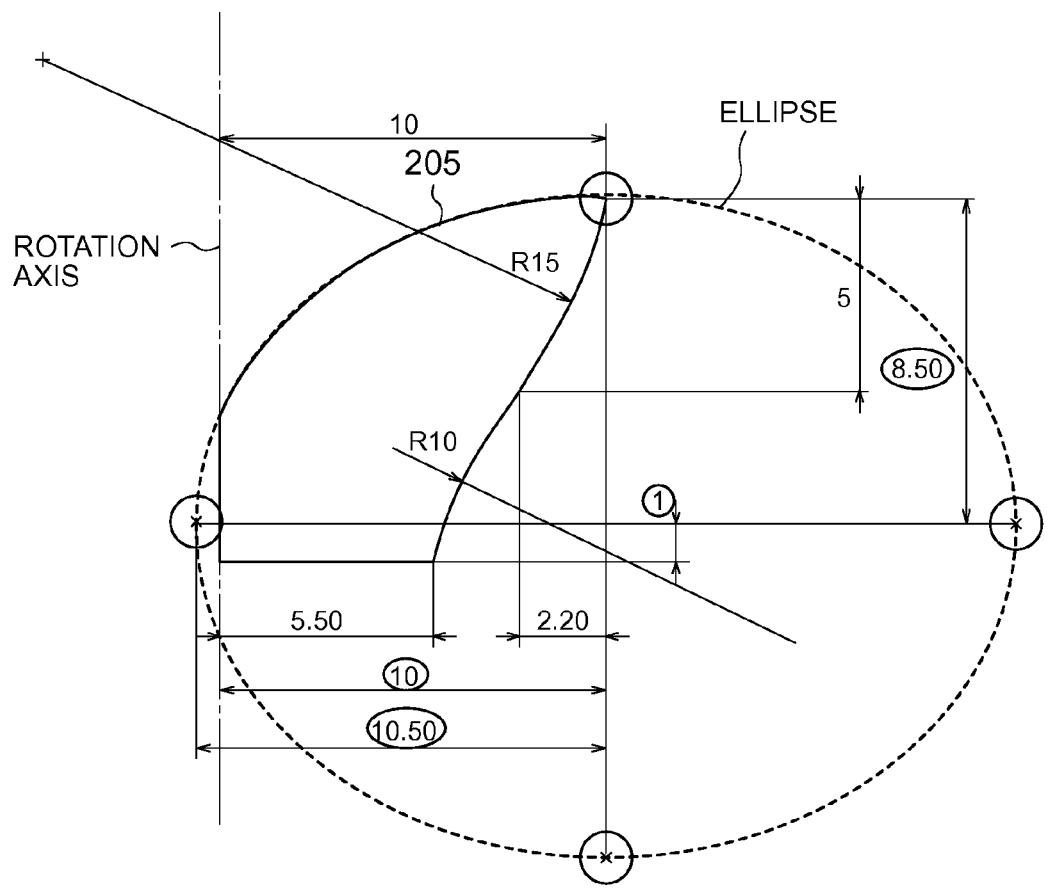
FIG. 2C shows the whole ellipse, a portion of which is shown in FIG. 2B.

FIG. 2C shows the whole of the ellipse, a portion of which is shown in FIG. 2B. Figures in circles in FIGS. 2B and 2C concretely represent the central position and lengths of the major and minor axes of the ellipse.

Figure 3:
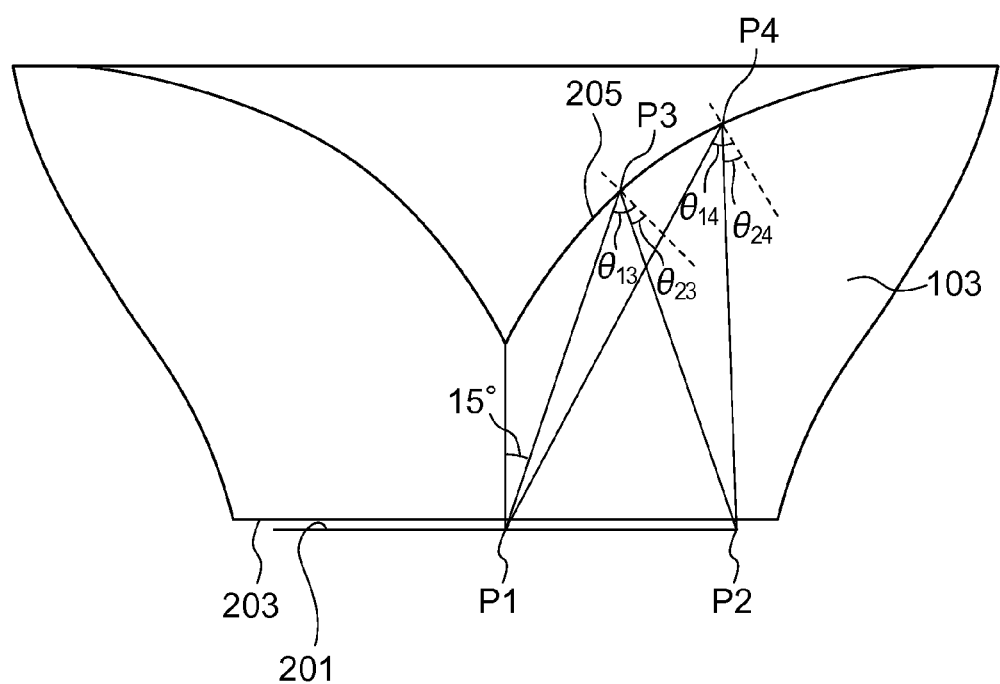
FIG. 3 illustrates a shape of a cross section including the optical axis of the light exit surface of the optical element.

FIG. 3 illustrates a shape of a cross section including the optical axis of the light exit surface 205 of the optical element 103. The optical element 103 has a shape shown in FIGS. 2A and 2B. In FIG. 3, the intersection of the optical axis and the light emitting surface 201 is designated as a first point P1. Further, a point on the circumference of the light emitting surface 201 is designated as a second point P2. Further, a point on the light exit surface 205 which viewing angle from the first point P1 with respect to the optical axis is 15 degrees is designated as a third point P3. Further, the intersection of the normal to the light emitting surface 201 at the second point P2 is designated as a fourth point P4.

An angle of incidence to the first light exit surface 205 of the ray which has emitted at the first point P1 and reaches the third point P3 is designated as $\theta_{13}$, an angle of incidence to the first light exit surface 205 of the ray which has emitted at the second point P2 and reaches the third point P3 is designated as $\theta_{23}$, an angle of incidence to the first light exit surface 205 of the ray which has emitted at the first point P1 and reaches the fourth point P4 is designated as $\theta_{14}$, and an angle of incidence to the first light exit surface 205 of the ray which has emitted at the second point P2 and reaches the fourth point P4 is designated as $\theta_{24}$. Radius of the planar light surface 101 is r=4 (millimeters) while the critical angle is $\theta_c$=39.1 degrees. The following expressions can be obtained through geometric relationships.

$$\theta_{13} - \theta_{23} = 35.9° \quad (1)$$

$$\theta_{14} - \theta_{24} = 26.6° \quad (2)$$

$$(\theta_{14} - \theta_{24})/(\theta_{13} - \theta_{23}) = 0.74 \quad (3)$$

$$\theta_{13} = 61.7° \quad (4)$$

$$\theta_{23} = 25.8° \quad (5)$$

$$B/A = 17.08 \quad (6)$$

$$C/A = 6.25 \quad (7)$$

$$D/r = 2.38 \quad (8)$$

$$E/r = 1.48 \quad (9)$$

$$F/r = 0.025 \quad (10)$$

X coordinate of the point on the first light exit surface 205 which is the most distant from the optical axis is 10 (millimeters) while that of the second point P2 is 4 (millimeters). Accordingly, the ratio of the former to the latter is 2.5.

$\theta_{13}$ is 61.7° while $\theta_{13}$ is 56.0°. Thus, an angle of incidence to the first light exit surface 205 of a ray which has left the first point P1 and reaches a point between the third point P3 and the fourth point P4 on the first light exit surface 205 is greater than the critical angle $\theta c = 39.1$. Accordingly, a ray which has left the first point P1 and reaches a point between the third point P3 and the fourth point P4 on the first light exit surface 205 undergoes total internal reflection on the first light exit surface 205. Further, in the present embodiment, a ray which has left the first point P1 and reaches any point outside the third point P3 undergoes total internal reflection on the first light exit surface 205.

$\theta_{23}$ is 25.8° while $\theta_{24}$ is 29.4°. Thus, an angle of incidence to the first light exit surface 205 of a ray which has left the second point P2 and reaches a point between the third point P3 and the fourth point P4 on the first light exit surface 205 is smaller than the critical angle $\theta c = 39.1$. Accordingly, a ray which has left the second point P2 and reaches a point between the third point P3 and the fourth point P4 on the first light exit surface 205 undergoes refraction at the first light exit surface 205, without undergoing total internal reflection. Further, in the present embodiment, a ray which has left the second point P2 and reaches any point on the optical axis side of the fourth point P4 undergoes refraction at the first light exit surface 205.

In the cross section of the first light exit surface 205 including the optical axis and the second point P2, an inclination of the first light exit surface 205 with respect to the straight line connecting the first point P1 and the second point P2 is 20 degrees or less in at least a portion of a place which viewing angle from the first point P1 with respect to the optical axis is 25 degrees or more The inventor has found that a ratio between an amount of light which undergoes total internal reflection on the first light exit surface 205 and that of light which undergoes refraction at the first light exit surface 205 when light emitted at various points of the surface light source reaches the first light exit surface 205 can be determined appropriately so that not only areas at the front of the light source but also those at the sides and the rear of the light source can be illuminated uniformly by forming the first light exit surface 205 as described below. In the cross section of the optical element 103 including the optical axis and the second point P2, assume that the first point P1 is the origin and the axis connecting the first point P1 and the second point P2 is x axis. The first light exit surface 205 is formed in such a way that light emitted at the first point P1 undergoes total internal reflection in 80% or more of an area in which x coordinate is equal to or greater than that of the third point P3 and light emitted at the second point P2 undergoes not total internal reflection but refraction in 80% or more of an area in which x coordinate is equal to or less than that of the fourth point P4. When the first light exit surface 205 is formed as described above, most of light which has been emitted at the first point P1 on the light emitting surface 201 and reaches an area which is outside the third point P3 of the first light exit surface 205 undergoes total internal reflection on the first light exit surface 205 while most of light which has been emitted at the second point P2 on the light emitting surface 201 and reaches an area which is on the side of the optical axis with respect to the fourth point P4 of the first light exit surface 205 undergoes refraction at the first light exit surface 205. For light which has been emitted at a point between the first point P1 and the second point P2 and reaches the first light exit surface 205, a ratio between an amount of light which undergoes total internal reflection on the first light exit surface 205 and that of light which undergoes refraction at the first light exit surface 205 is determined according to x coordinate of the point. In general, as x coordinate of a light emitting point approaches that of the first point P1, a ratio of an amount of light which undergoes total internal reflection on the first light exit surface 205 increases while as x coordinate of a light emitting point approaches that of the first point P2, a ratio of an amount of light which undergoes refraction at the first light exit surface 205 increases. Accordingly, by forming the first light exit surface 205 as described above, a ratio of an amount of light which undergoes total internal reflection on the first light exit surface 205 and that of light which undergoes refraction at the first light exit surface 205 to the light emitted at various points on the surface light source can be determined appropriately.

By changing a ratio of x coordinate of the point which is the most distant from the optical axis on the first light exit surface 205 to x coordinate of the second point P2, a ratio between an amount of light which undergoes total internal reflection on the first light exit surface 205 and that of light which undergoes refraction at the first light exit surface 205 can be further adjusted. In general, the ratio of the x coordinate of the point which is the most distant from the optical axis on the first light exit surface 205 to the x coordinate of the second point P2 should preferably be 1.5 or more.

"80% or more" means that in x coordinate. The reason that "80% or more" is defined is to exclude exceptional areas such as those around singular points.

Further, when a ratio of x coordinate of the point which is the most distant from the optical axis on the first light exit surface 205 to x coordinate of the point P2 is 2.0 or more, light can be more efficiently distributed to the rear of the light source.

In general, a shape of the first light exit surface 205 can be determined as described below. The shape of the cross section of the first light exit surface 205 including the optical axis and the second point P2 is referred to as profile. At first, assume that the profile can be represented as a straight line connecting the third point P3 and the fourth point P4. An inclination of the straight line is determined such that both $\theta_{13}$ and $\theta_{14}$ are equal to or greater than the critical angle and both $\theta_{23}$ and $\theta_{24}$ are equal to or smaller than the critical angle. When the inclination is determined as described above, an angle of incidence to a point on the straight line outside of the third point P3 of a ray which has been emitted at the point P1 is greater than the critical angle, and therefore a ray undergoes total internal reflection. Further, an angle of incidence to a point on the straight line on the optical axis side of the fourth point P4 of a ray which has been emitted at the second point P2 is smaller than the critical angle, and therefore the light undergoes refraction.

In order to increase a ratio of an amount of light which undergoes total internal reflection on the first light exit surface 205, the following steps should be performed. By increasing an angle of incidence to the first light exit surface 205 of a ray which has been emitted at the second point P2 and reaches the fourth point P4, a ratio of an amount of light which has been emitted at a point between the first point P1 and the second point P2 and undergoes total internal reflection on the first light exit surface 205 will increase. Further, by increasing a ratio of x coordinate of the point which is the most distant from the optical axis on the first light exit surface 205 to that of the second point P2, the ratio of the light which undergoes total internal reflection will further increase.

In order to increase a ratio of an amount of light which undergoes total internal reflection on the first light exit surface 205 and is used to illuminate areas at the rear of the light source, the following steps should be performed. By decreasing an inclination of the profile around and outside of the fourth point P4 with respect to x axis and moving the point which is the most distant from the optical axis on the first light exit surface 205 away from the light source to increase a ratio of x coordinate of the point to x coordinate of the second point P2, while satisfying the condition that $\theta_{24}$ is smaller than the critical angle, the ratio of an amount of light which undergoes total internal reflection on the first light exit surface 205 and is used to illuminate areas at the rear of the light source will increase.

In order to increase a ratio of an amount of light which undergoes refraction at the first light exit surface 205, the following steps should be performed. By decreasing an inclination of the profile with respect to x axis around the third point P3 and on the optical axis side of the third point P3 while satisfying the condition that $\theta_n$ is equal to or greater than the critical angle, a ratio of an amount of light which undergoes refraction to the total amount of light which has been emitted at the first point P1 and reaches an area on the optical axis side of the third point P3 on the first light exit surface will increase.

Further, from another standpoint, in order to uniformly illuminate areas not only at the front of but also at the sides and rear of the light source by appropriately determining a ratio of an amount of light which undergoes total internal reflection on the first light exit surface 205 and that of light which undergoes refraction at the first light exit surface 205 to the total amount of light which has been emitted at various points on the surface light source, the conditions represented by the following expressions should be satisfied.

$$15° \leq \theta_{13} - \theta_{23} \leq 70° \quad (1)$$

$$15° \leq \theta_{14} - \theta_{24} \leq 65° \quad (2)$$

$$0.2 \leq (\theta_{14} - \theta_{24})/(\theta_{13} - \theta_{23}) \leq 1 \quad (3)$$

When the value of Expression (1) is above the upper limit or the value of Expression (2) is below the lower limit, an inclination of the hollow around the optical axis on the first light exit surface 205 is too steep, and therefore the number of rays travelling in the forward direction will be reduced. Accordingly, a ratio between an amount of light which undergoes total internal reflection on the first light exit surface 205 and that of light which undergoes refraction at the first light exit surface 205 is not appropriate. On the other hand, when the value of Expression (1) is below the lower limit or the value of Expression (2) is above the upper limit, an inclination of the hollow around the optical axis on the first light exit surface 205 is too gradual, and therefore most of rays will travel in the forward direction. Accordingly, a ratio between an amount of light which undergoes total internal reflection on the first light exit surface 205 and that of light which undergoes refraction at the first light exit surface 205 is not appropriate. Further, when the condition represented by Expression (3) is not satisfied, a ratio between an amount of light which undergoes total internal reflection on the first light exit surface 205 and that of light which undergoes refraction at the first light exit surface 205 is not appropriate.

Further, when the following conditions are satisfied, a ratio between an amount of light which undergoes total internal reflection on the first light exit surface 205 and that of light which undergoes refraction at the first light exit surface 205 can be set more appropriately.

$$25° \leq \theta_{13} - \theta_{23} \leq 50° \quad (1)'$$

$$20° \leq \theta_{14} - \theta_{24} \leq 45° \quad (2)'$$

$$0.4 \leq (\theta_{14} - \theta_{24})/(\theta_{13} - \theta_{23}) \leq 0.8 \quad (3)'$$

Further, when the following conditions are satisfied, a shape of a portion around the third point P3 on the first light exit surface 205 can be determined such that a ratio between an amount of light which undergoes total internal reflection on the first light exit surface 205 and that of light which undergoes refraction at the first light exit surface 205 is more appropriate.

$$\theta_c \leq \theta_{13} \quad (4)$$

$$\theta_{23} \leq \theta_c \quad 5)$$

Further, when the following conditions are satisfied, a ratio of between an amount of light which undergoes total internal reflection on the first light exit surface 205 and that of light which undergoes refraction at the first light exit surface 205 can be set more appropriately.

$$\theta_c \leq \theta_{13} - 10° \quad (4)'$$

$$\theta_{23} \leq \theta_c - 5° \quad (5)'$$

Further, as to a ratio of a size of the optical element to that of the light source, the conditions represented by the following expressions should preferably be satisfied.

$$3 \leq B/A \leq 60 \quad (6)$$

$$1 \leq C/A \leq 20 \quad (7)$$

$$1 \leq D/\sqrt{A/\pi} \leq 10 \quad (8)$$

$$0.25 \leq E/\sqrt{A/\pi} \leq 4 \quad (9)$$

When the value of any of Expressions (6) to (9) is below the lower limit, an amount of light which travels toward the front of the surface light source becomes too large while the value of any of Expressions (6) to (9) is above the upper limit, an amount of light which travels toward the sides and the rear of the surface light source becomes too large.

Further, when the conditions represented by the following expressions are satisfied, a more preferable light distribution is realized.

$$10 \leq B/A \leq 40 \quad (6)'$$

$$3 \leq C/A \leq 10 \quad (7)'$$

$$1.5 \leq D\sqrt{A/\pi} \leq 5 \quad (8)'$$

$$1 \leq E\sqrt{A/\pi} \leq 3 \quad (9)'$$

Further, the condition represented by the following expression should preferably be satisfied.

$$0 < F\sqrt{A/\pi} \leq 0.2 \quad (10)$$

When the value of Expression (10) is greater than the upper limit, a ratio of an amount of light which is caught by the light receiving surface 203 is reduced.

Figure 4A:
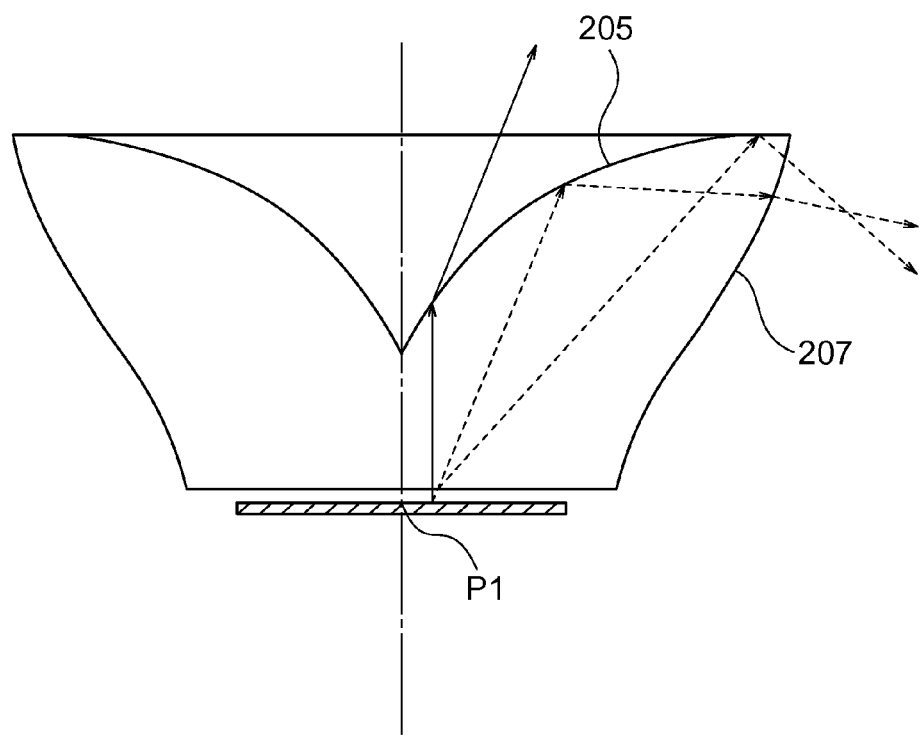
FIG. 4A shows paths of rays which have been emitted at a point around the first point P1 and reach the first light exit surface.

FIG. 4A shows paths of rays which have been emitted at a point around the first point P1 and reach the first light exit surface 205. In FIG. 4A, a ray which has been emitted at the point around the first point P1 and reaches an area around the optical axis on the first light exit surface 205 undergoes refraction without undergoing total internal reflection and travels forwards. However, in general, a ray which has been emitted at the point around the first point P1 and reaches an area around the optical axis on the first light exit surface 205 may undergo total internal reflection in some cases. A ray which has been emitted at the point around the first point P1 and reaches areas besides the area around the optical axis on the first light exit surface 205 undergoes total internal reflection and travels laterally or backwards. In FIG. 4A, rays which undergoes refraction at the first light exit surface 205 without undergoing total internal reflection are represented by solid lines while rays which undergo total internal reflection are represented by dotted lines.

Figure 4B:
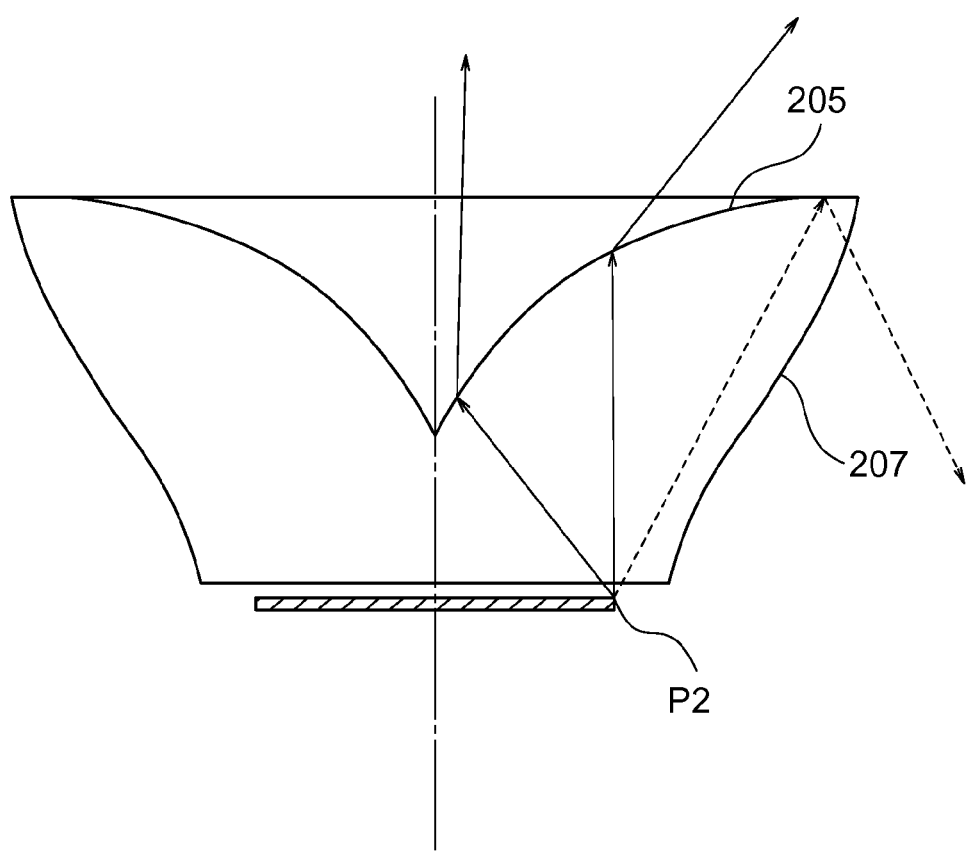
FIG. 4B shows paths of rays which have been emitted at the second point P2 and reach the first light exit surface.

FIG. 4B shows paths of rays which have been emitted at the second point P2 and reach the first light exit surface 205. In FIG. 4B, a ray which has been emitted at the second point P2 and reaches an area which is closer to the optical axis than the fourth point P4 on the first light exit surface 205 undergoes refraction without undergoing total internal reflection and travels forwards. A ray which has been emitted at the second point P2 and reaches the edge of the first light exit surface 205 undergoes total internal reflection on the first light exit surface 205. However, in general, a ray which has been emitted at the second point P2 and reaches the edge of the first light exit surface 205 may not undergo total internal reflection in some cases. In FIG. 4B, rays which undergoes refraction at the first light exit surface 205 without undergoing total internal reflection are represented by solid lines while rays which undergo total internal reflection are represented by dotted lines.

Figure 5:
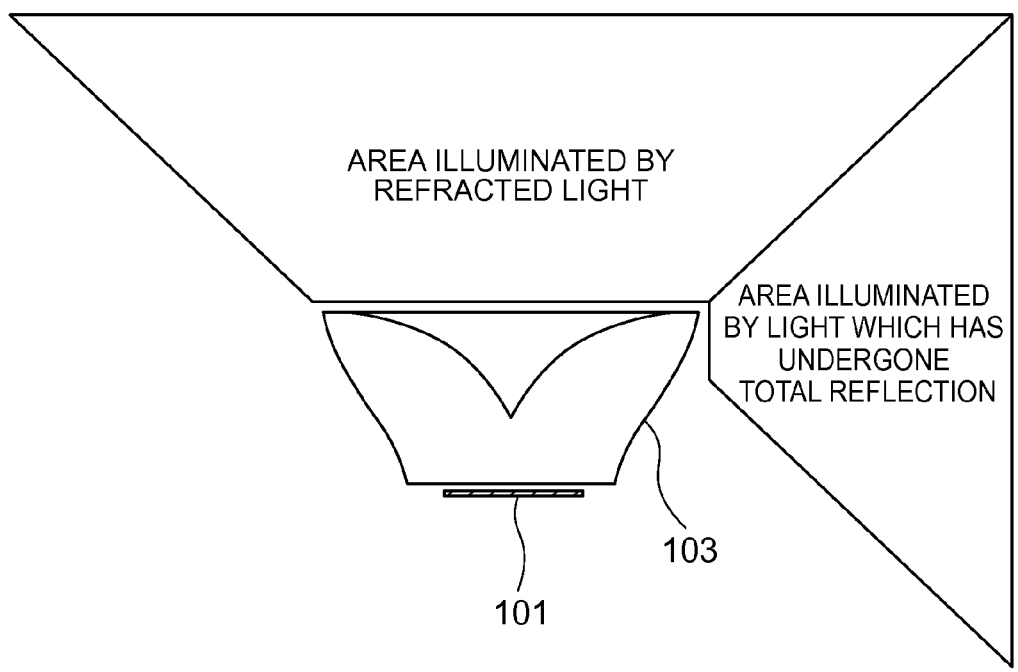
FIG. 5 is a conceptual diagram showing an area illuminated by refracted light and an area illuminated by light which has undergone total internal reflection in the illuminating device according to the present embodiment.

FIG. 5 is a conceptual diagram showing an area illuminated by refracted light and an area illuminated by light which has undergone total reflection in the illuminating device according to the present embodiment. Light which has been emitted by the surface light source 101 and refracted at the first light exit surface 205 illuminates an area at the front of the device. Light which has been emitted by the surface light source 101 and has undergone total reflection at the first light exit surface 205 illuminates areas at the sides and the rear of the device.

Figure 6:
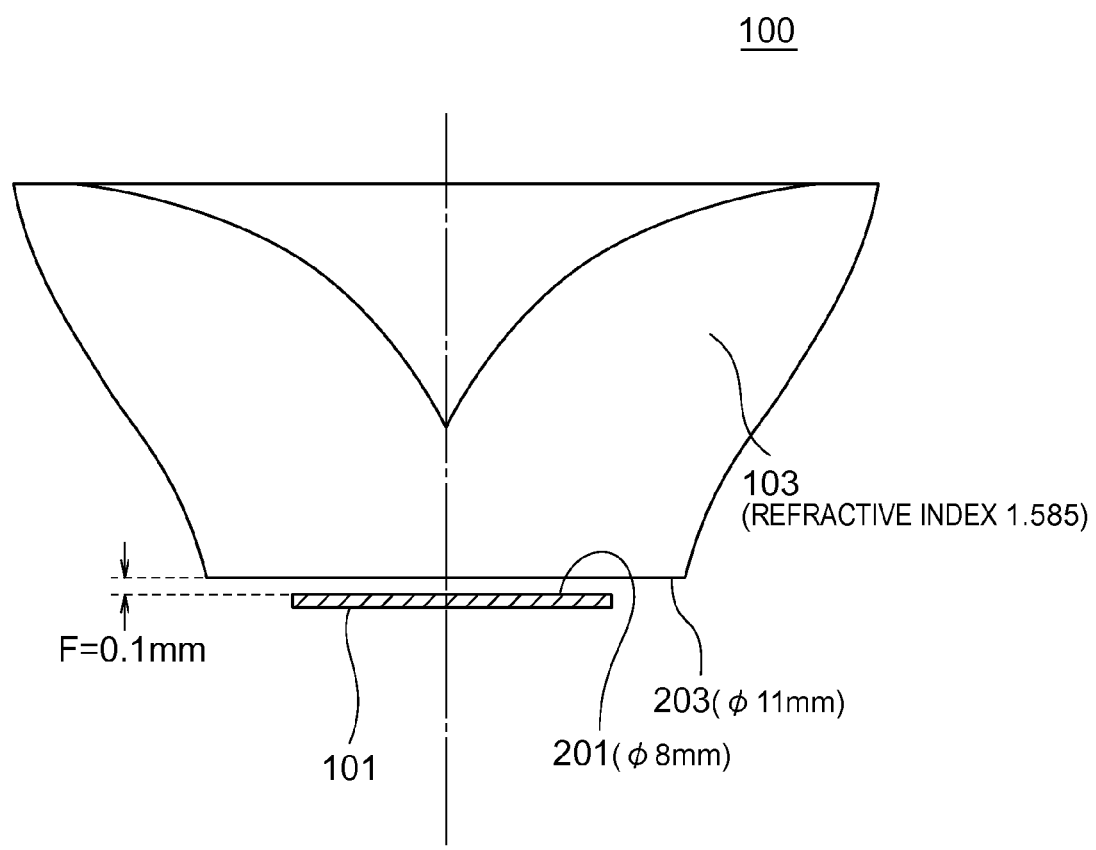
FIG. 6 shows a specific shape of the illuminating device according to the present embodiment.

FIG. 6 shows a specific shape of the illuminating device 100 according to the present embodiment. The surface light source 101 is of a circle which has a radius of 4 millimeters. The light receiving surface 203 of the optical element 103 is of a circle which has a radius of 5.5 millimeters. The shape of the optical element 203 is that shown in FIG. 2A and FIG. 2B. The optical element 103 is made of a transparent material which has a refractive index of 1.585 (for example, epoxy resin). However, in general, as a material of the optical element any material which is transparent for target wavelengths can be used.

Figure 7A:
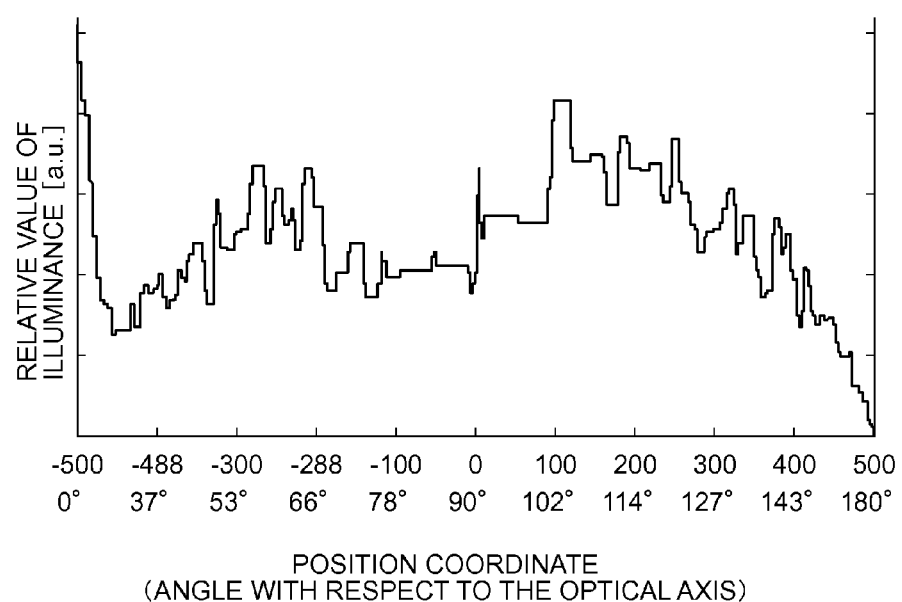
FIG. 7A shows a distribution of relative value of illuminance of the illuminating device according to the present embodiment.

FIG. 7A shows a distribution of relative value of illuminance of the illuminating device 100 according to the present embodiment. Relative value of illuminance is that on a sphere which has the center at the center of the light source (which corresponds to the first point P1) and a radius of 500 millimeters. The horizontal axis of FIG. 7A represents angle with respect to the optical axis while the vertical axis represents relative value of illuminance. Values between −500 and +500 shown along the horizontal axis correspond to y coordinate of a position when the origin is set on the light emitting surface 201 and the negative direction is set to the direction of the optical axis. Values between 0° and 180° represents angle θ with respect to the direction of the optical axis when a point which corresponds to the y coordinate on the sphere which has the center on the light emitting surface 201 and a radius of 500 millimeters is seen from the origin. A relation shown by the following expression is held.

$$\theta = \frac{360}{2\pi} \times \cos^{-1}\left(\frac{-Y}{500}\right)$$

FIG. 7A shows values of relative illuminance at angles between 0° and approximately 160° are equal to or greater than a half of the average value while those at angles between approximately 30° and approximately 140° are equal to or greater than two-thirds of the average value.

Figure 7B:
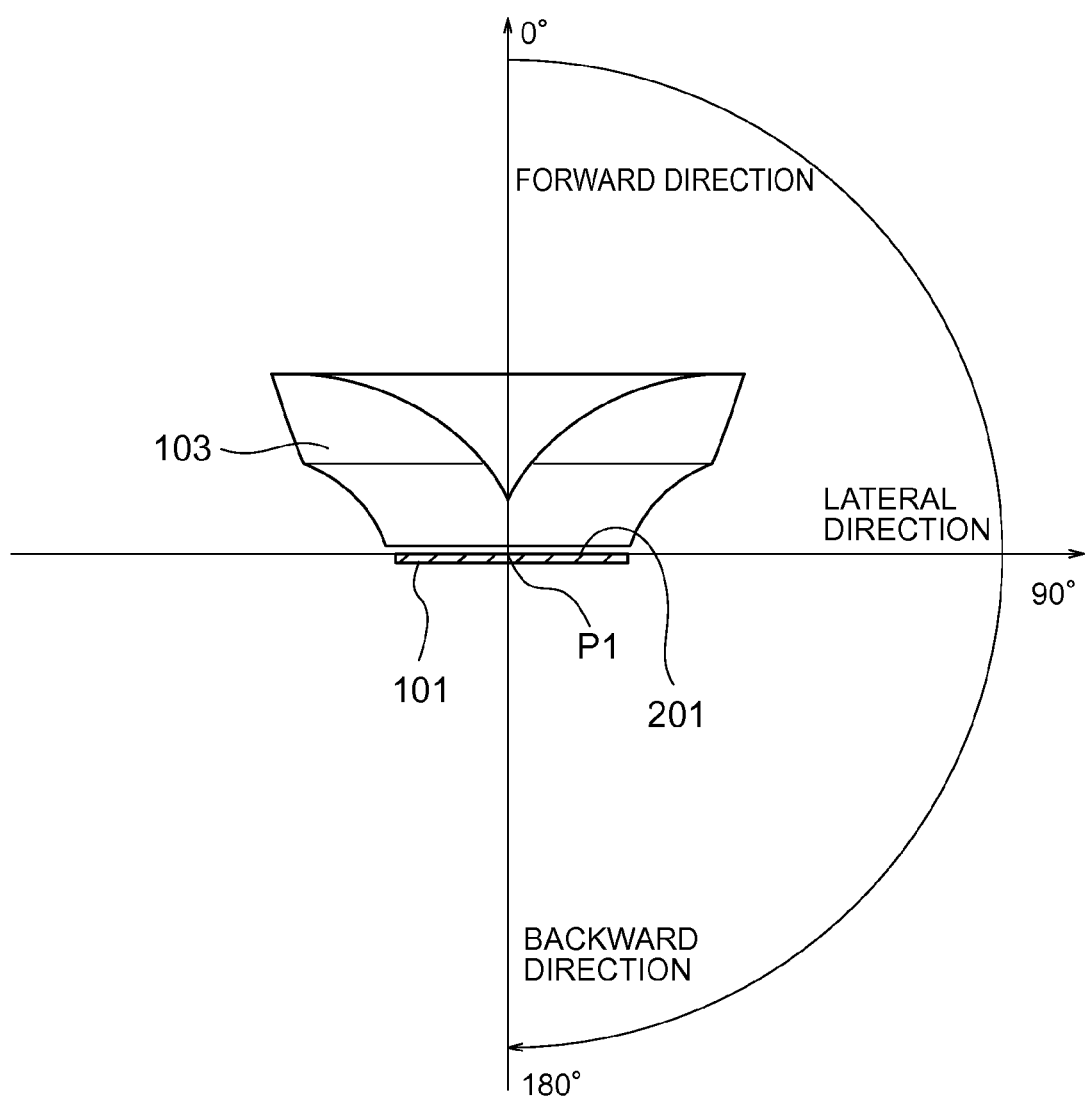
FIG. 7B illustrates angle with respect to the optical axis.

FIG. 7B illustrates angle with respect to the optical axis. Angle with respect to the optical axis means an angle between a straight line extending from the center of the light source and the optical axis. For example, a value of relative illuminance at the angle of 90° is that at the intersection of a straight line extending from the center of the light source in the horizontal direction and the above-described sphere. Angle with respect to the optical axis of 0° represents the direction toward the front of the surface light source 101 (the forward direction) while angle with respect to the optical axis of 180° represents the direction toward the rear of the surface light source 101 (the backward direction).

FIGS. 8A to 8H show paths of rays in different directions of illumination, respectively.

Figure 8A:
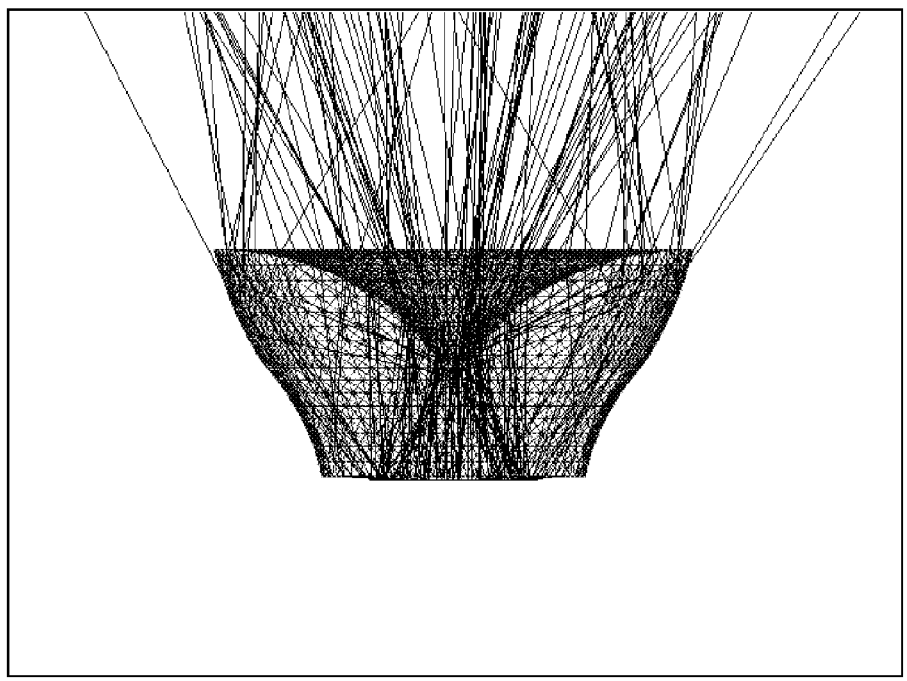
FIG. 8A shows paths of rays of illumination in the forward direction.

FIG. 8A shows paths of rays in the forward direction of illumination. Most rays undergo refraction at the first light exit surface 205 and travel toward the front.

Figure 8B:
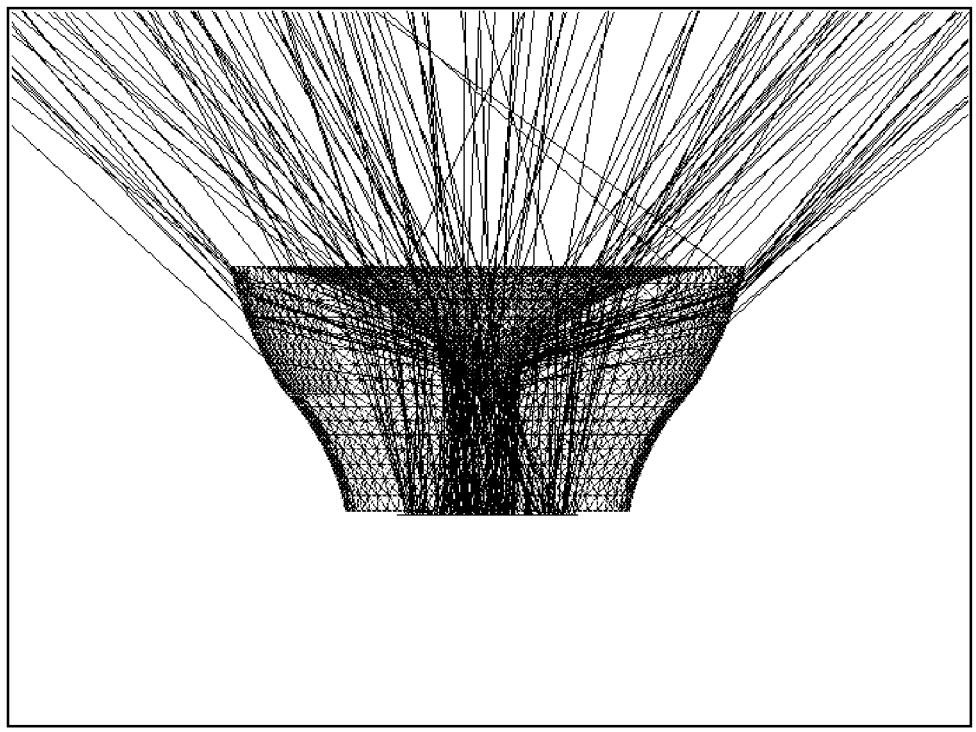
FIG. 8B shows paths of rays of illumination in directions at angles with respect to the optical axis which are less than 90°.

FIG. 8B shows paths of rays in directions at angles with respect to the optical axis which are less than 90°. There exist rays which undergo refraction at the first light exit surface 205 and travel toward the front and rays which undergo total internal reflection on the first light exit surface 205 and refraction at the second light exit surface 207 and travel toward the front.

Figure 8C:
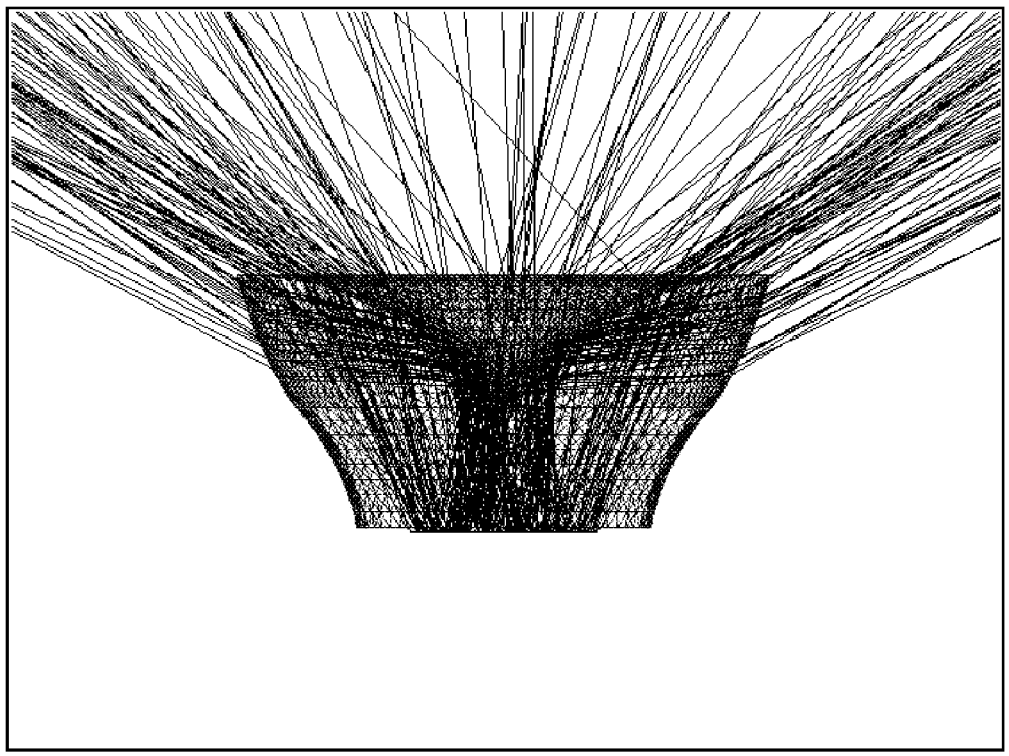
FIG. 8C shows paths of rays of illumination in directions at angles with respect to the optical axis which are less than 90° and greater than the angles of FIG. 8B.

FIG. 8C shows paths of rays in directions at angles with respect to the optical axis which are less than 90° and greater than the angles of FIG. 8B. Approximately half of the rays undergo total internal reflection on the first light exit surface 205 and refraction at the second light exit surface 207 and travel toward the front.

Figure 8D:
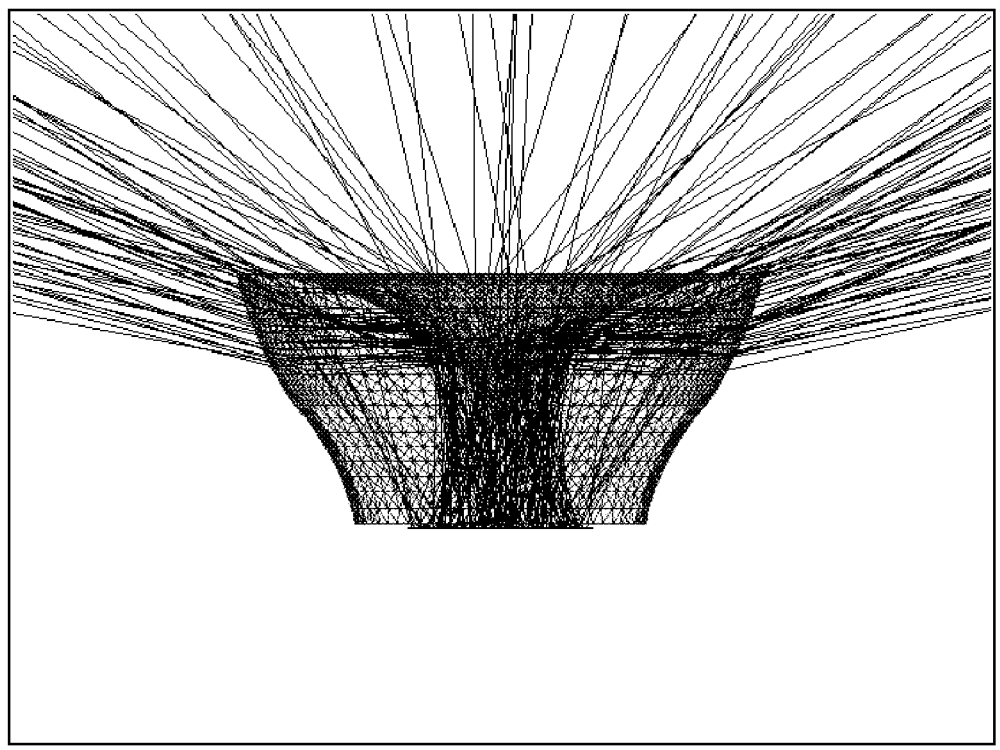
FIG. 8D shows paths of rays of illumination in directions at angles with respect to the optical axis which are less than 90° and greater than the angles of FIG. 8C.

FIG. 8D shows paths of rays in directions at angles with respect to the optical axis which are less than 90° and greater than the angles of FIG. 8C. Most of rays undergo total internal reflection on the first light exit surface 205 and refraction at the second light exit surface 207 and travel toward the front.

Figure 8E:
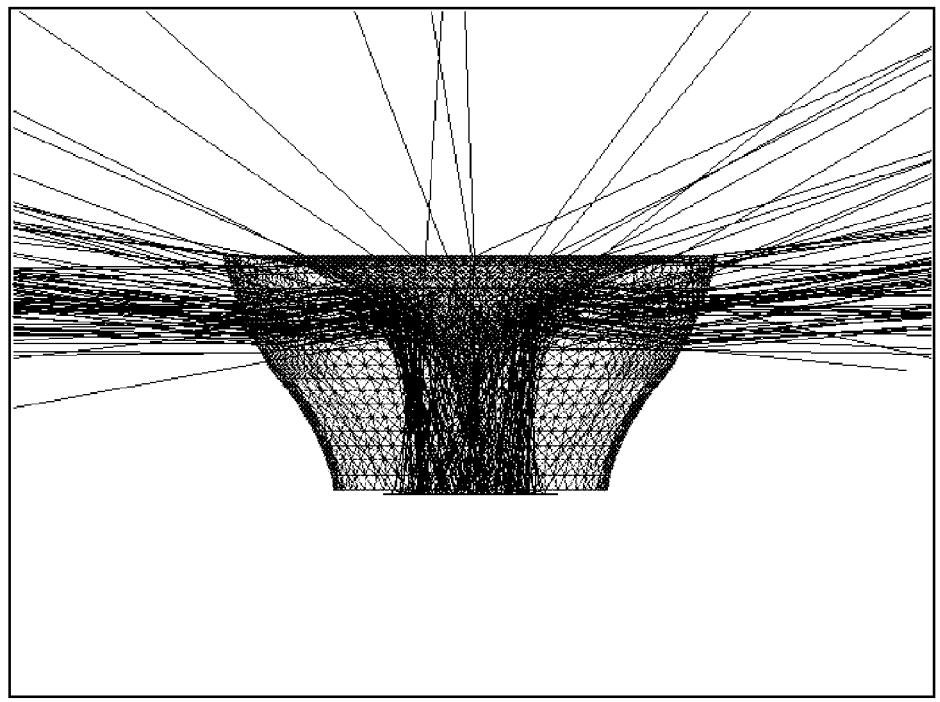
FIG. 8E shows paths of rays of illumination in directions with respect to the optical axis which are approximately 90°.

FIG. 8E shows paths of rays in directions with respect to the optical axis which are approximately 90°. Most of rays undergo total internal reflection on the first light exit surface 205 and refraction at the second light exit surface 207 and travel toward the sides.

Figure 8F:
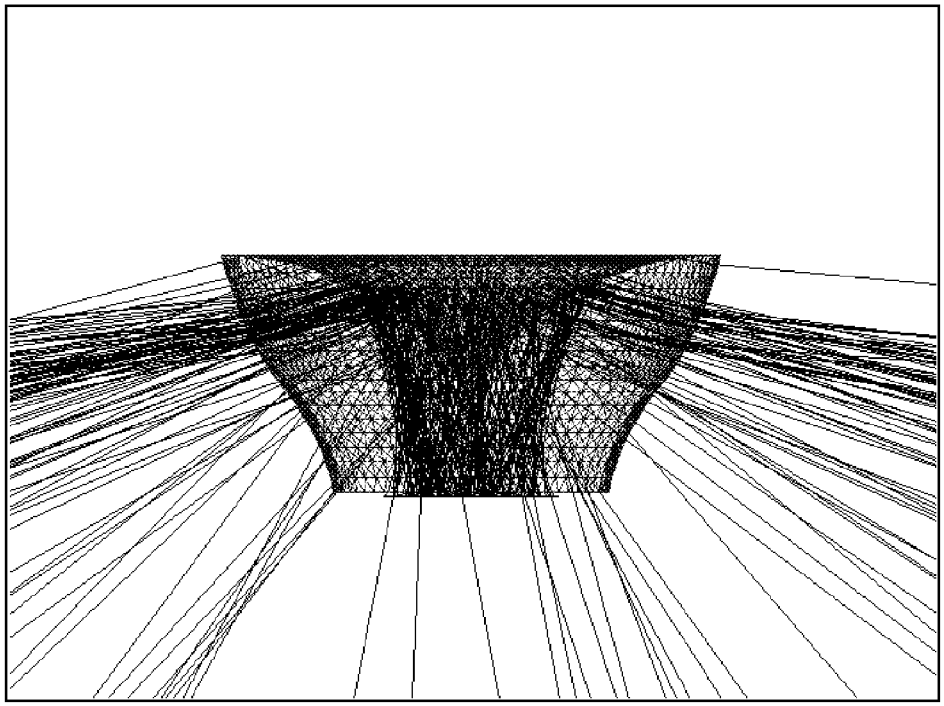
FIG. 8F shows paths of rays of illumination in directions at angles with respect to the optical axis which are greater than 90°.

FIG. 8F shows paths of rays in directions at angles with respect to the optical axis which are greater than 90°. Most of rays undergo total internal reflection on the first light exit surface 205 and refraction at the second light exit surface 207 and travel toward the rear.

Figure 8G:
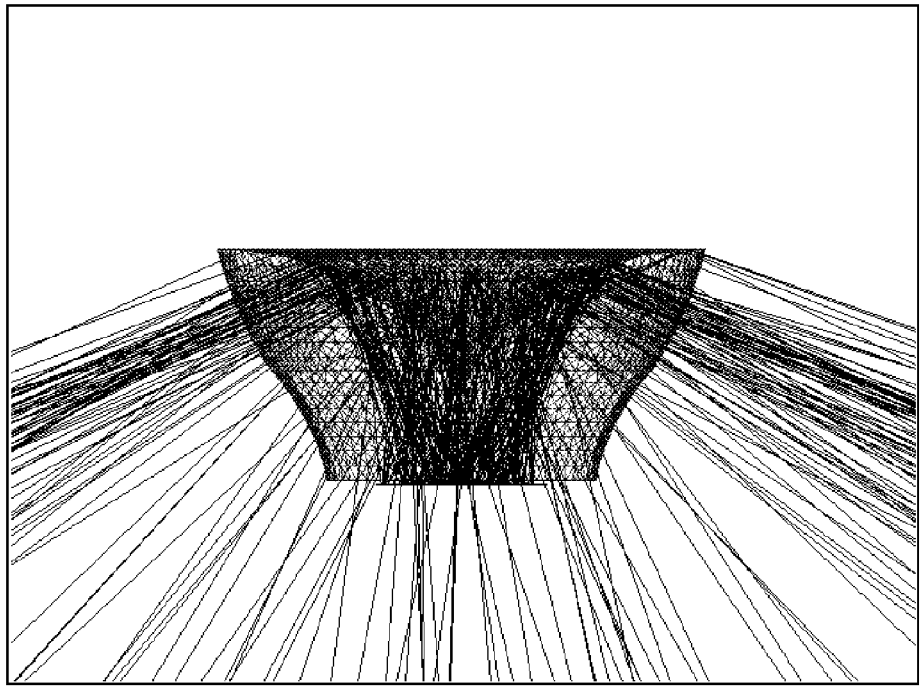
FIG. 8G shows paths of rays of illumination in directions at angles with respect to the optical axis which are greater than 90° and greater than the angles of FIG. 8F.

FIG. 8G shows paths of rays in directions at angles with respect to the optical axis which are greater than 90° and greater than the angles of FIG. 8F.

Most of rays undergo total internal reflection on the first light exit surface 205 and refraction at the second light exit surface 207 and travel toward the rear.

Figure 8H:
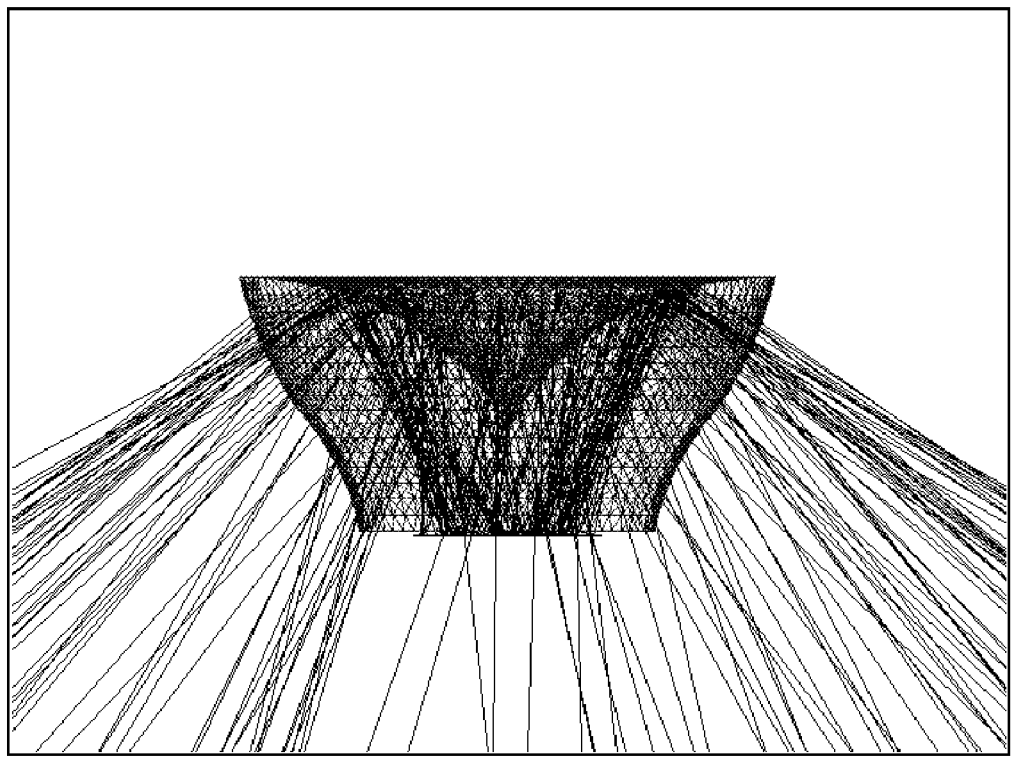
FIG. 8H shows paths of rays of illumination in directions at angles with respect to the optical axis which are greater than 90° and greater than the angles of FIG. 8G.

FIG. 8H shows paths of rays in directions at angles with respect to the optical axis which are greater than 90° and greater than the angles of FIG. 8G.

Most of rays undergo total internal reflection on the first light exit surface 205 and refraction at the second light exit surface 207 and travel toward the rear.

Figure 9:
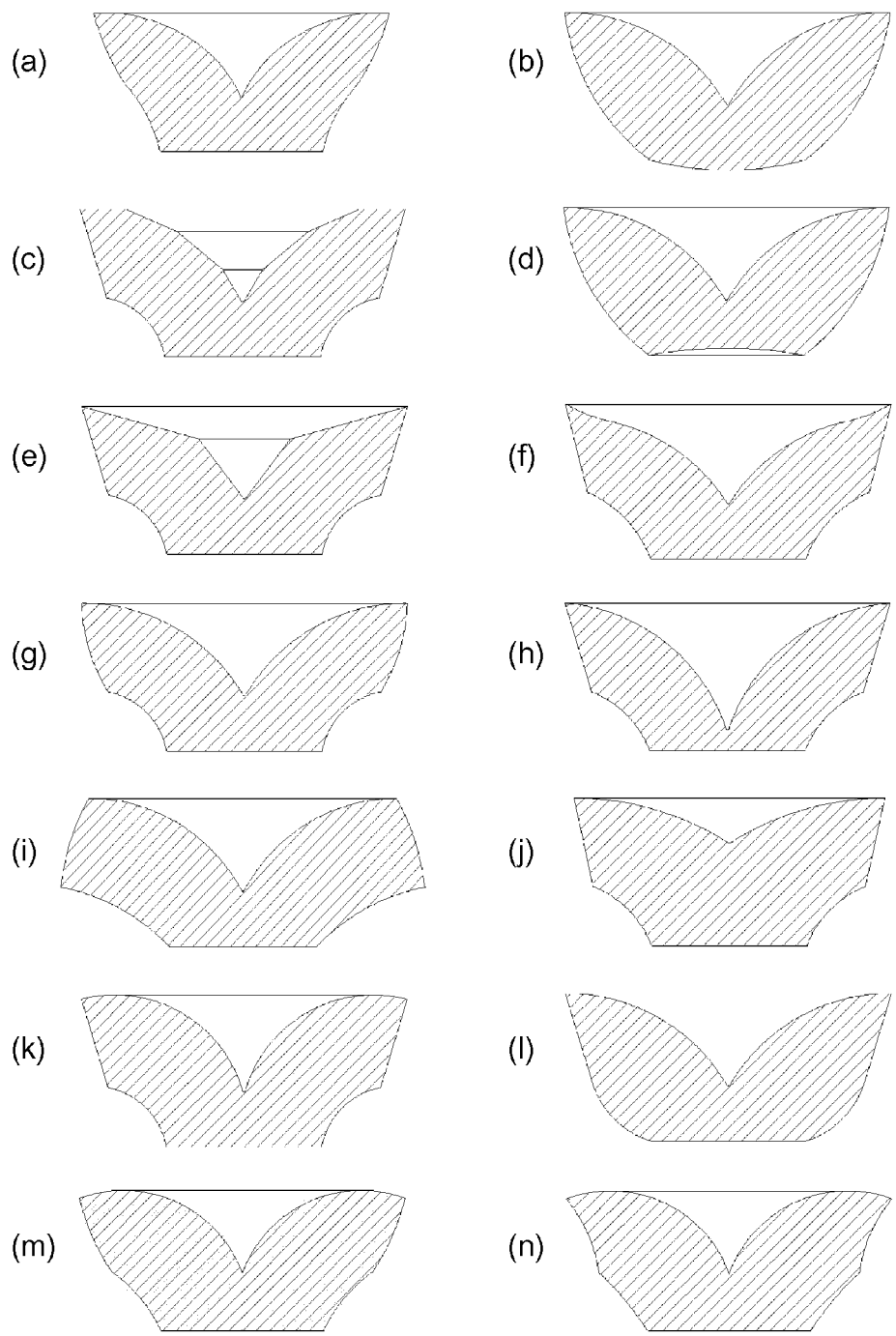
FIG. 9 shows specific shapes (shapes of cross section containing the optical axis) of optical elements according to other embodiments.

FIG. 9 shows specific shapes (shapes of cross section containing the optical axis) of optical elements according to other embodiments. In the embodiments shown in FIG. 9, curves or polygonal lines representing the first light exit surface are convex opposite toward the surface light source.

Figure 10:
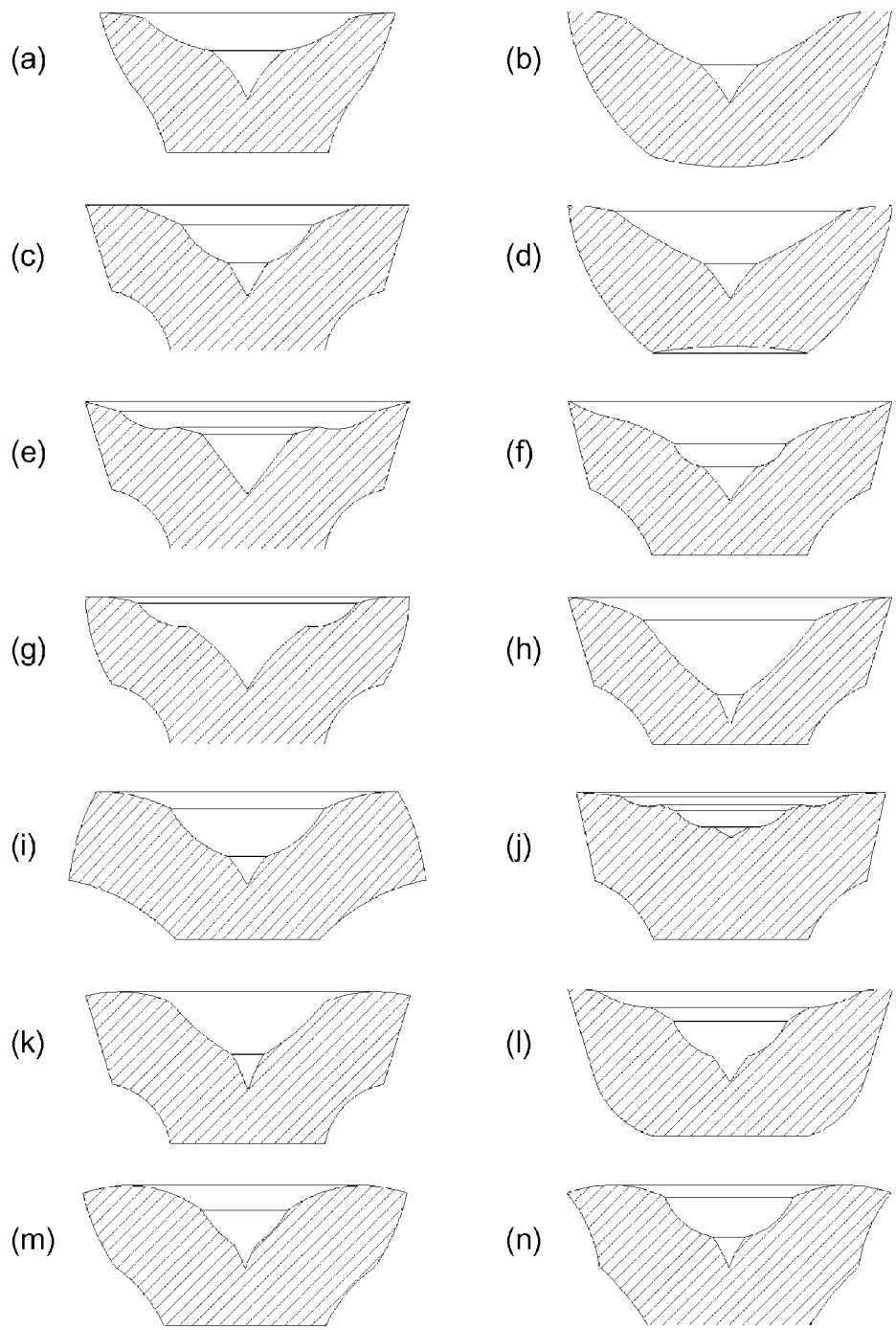
FIG. 10 shows specific shapes (shapes of cross section containing the optical axis) of optical elements according to further other embodiments.

FIG. 10 shows specific shapes (shapes of cross section containing the optical axis) of optical elements according to further other embodiments. In the embodiments shown in FIG. 10, a segment of curves or polygonal lines representing the first light exit surface is convex toward the surface light source.

Figure 11:
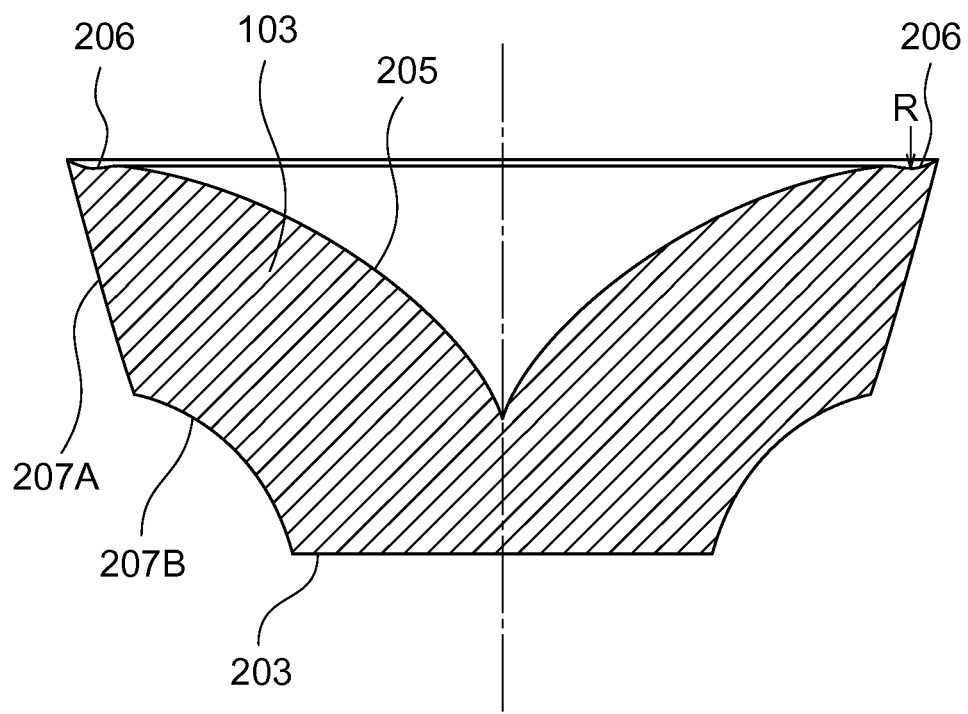
FIG. 11 shows an embodiment of an optical element which is provided with an optical surface for diffusing light between the first light exit surface and the second light exit surface.

FIG. 11 shows an embodiment of an optical element which is provided with an optical surface for diffusing light 206 between the first light exit surface 205 and the second light exit surface 207. In an area in which rays having different paths interfere with one another, unevenness of rays tends to show up. In order to reduce the unevenness of rays, an optical surface for diffusing light is provided around an area in which refractive power of the lens changes discontinuously. The optical surface for diffusing light has a concave shape with a constant radius of curvature R. The condition represented by the following expression should preferably be satisfied.

$$R/\sqrt{A/\pi} \leq 0.5 \tag{11}$$

When the value of the expression exceeds the upper limit, effect of diffusing light will be reduced.

Figure 12:
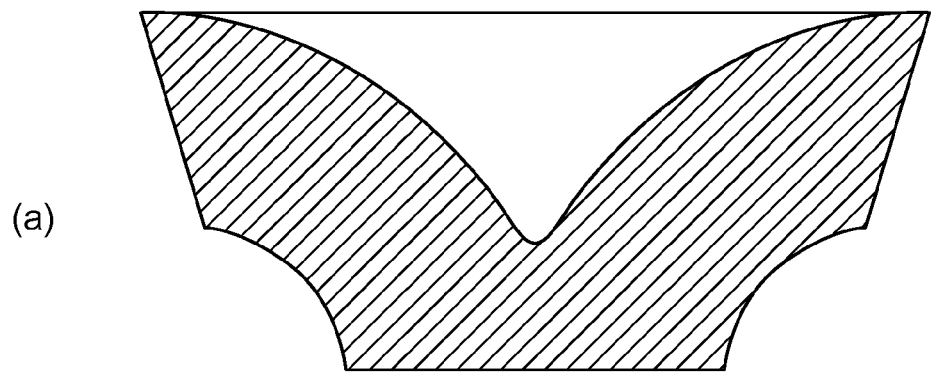
FIG. 12 shows various shapes around the bottom of the hollow of an optical element.
Figure 12:
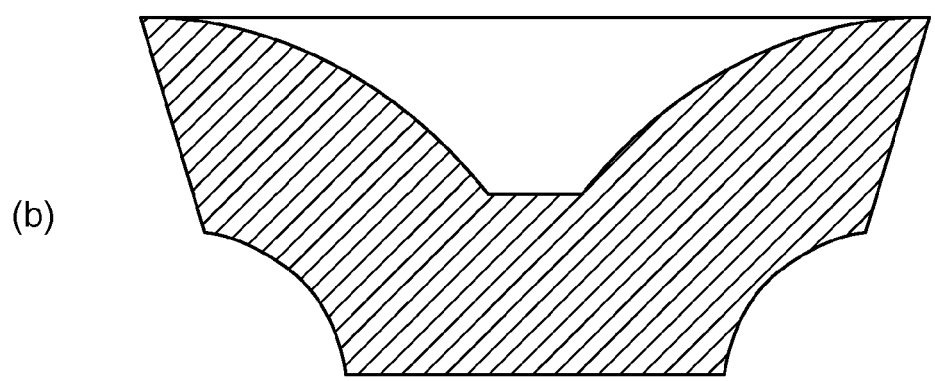
Figure 12:
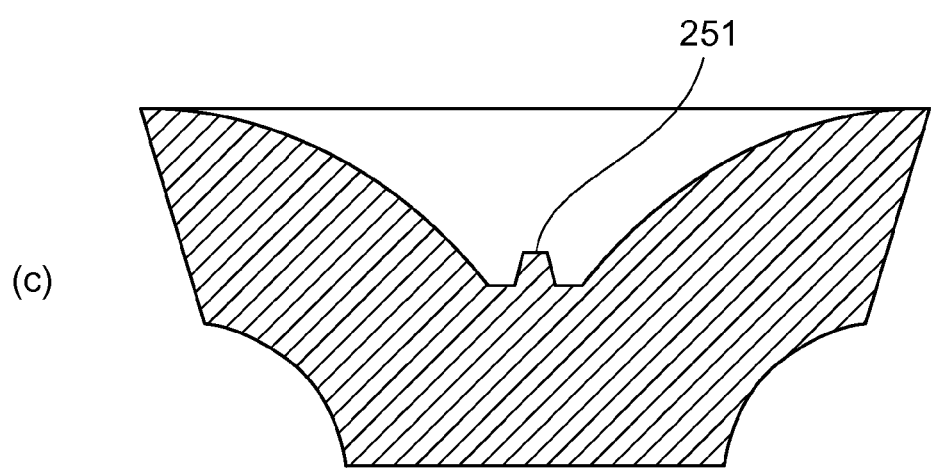

FIG. 12 shows various shapes around the bottom of the hollow of an optical element. For example, rays collecting around the optical axis can be diffused by a projection 251 provided at the bottom of the hollow.

Figure 13:
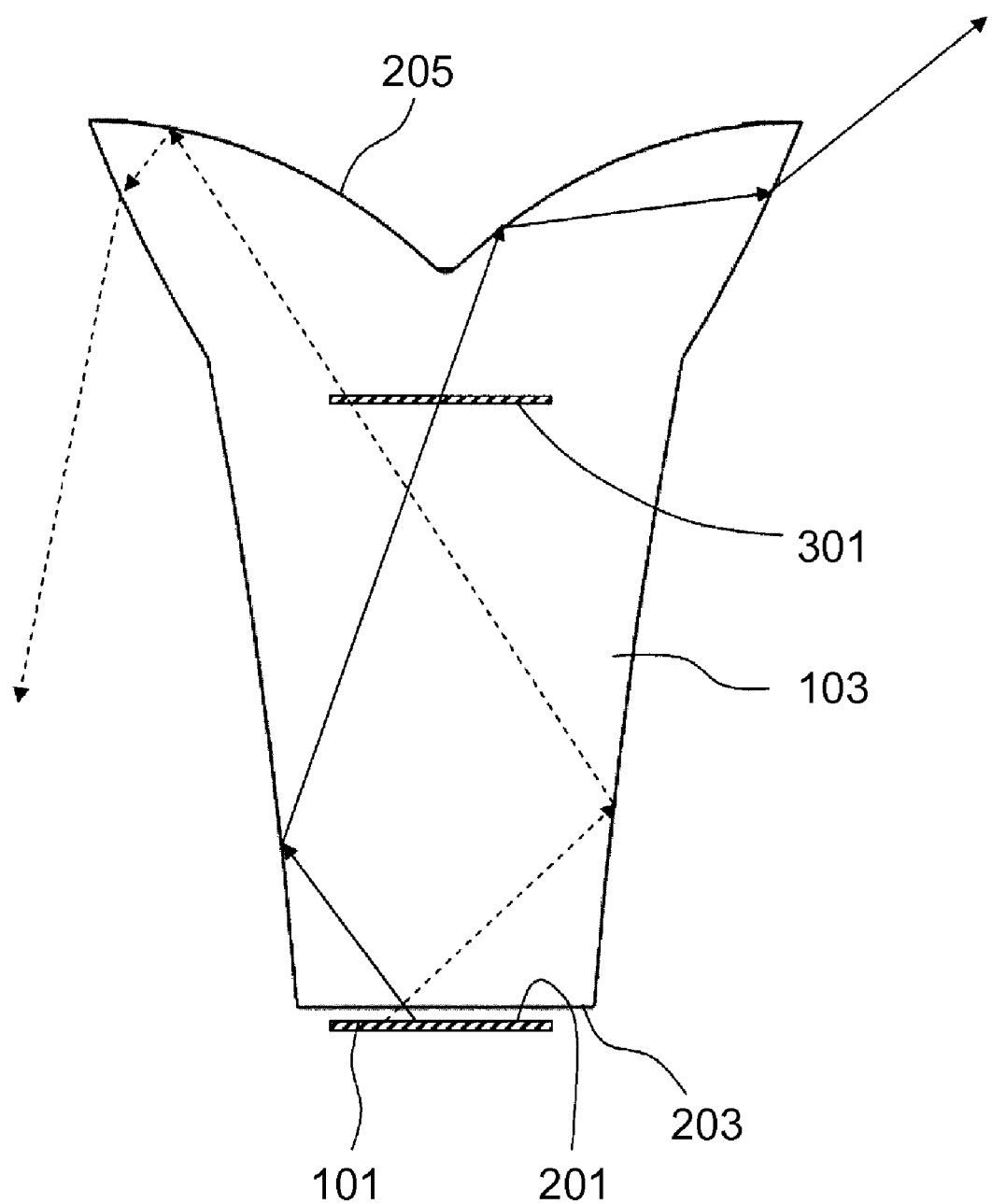
FIG. 13 shows a configuration of an illuminating device according to another embodiment of the present invention.

FIG. 13 shows a configuration of an illuminating device according to another embodiment of the present invention. The illuminating device according to the present embodiment includes a planer light source 101 and an optical element 103. Rays emitted at a light emitting surface 201 of the planer light source 101 enter the optical element 103 through a light receiving surface 203. Rays corresponding to more than a half of the light emitted by the light source undergo total internal reflection on a portion close to the light receiving surface 203 of the second light exit surface 208 between the light receiving surface 203 and the first light exit surface 205 and is directed in the direction of the optical axis to form a virtual light emitting surface 301. The virtual light emitting surface 301 is located in the optical element 103 and is away from the light emitting surface 201 by distance of H. The virtual light emitting surface 301 has a shape which is identical with that formed by projecting the light emitting surface 201 onto a plane parallel to the light emitting surface 201. When an area of the light emitting surface is designated as A, H should be determined such that the condition represented by the following expression is satisfied and that rays at an angle of view of 15 degrees with respect to the optical axis passing thorough the center of the virtual light emitting surface 301 exist.

$$2 \leq H/\sqrt{A/\pi} \leq 15 \tag{12}$$

Rays which have passed through the virtual light emitting surface 301 travel along paths in which rays undergo refraction at the first light exit surface 205 and are emitted toward the outside of the optical element 103 and along paths in which rays undergo total internal reflection on the first light exit surface 205, then undergo refraction at the second light exit surface 208 and are emitted toward the outside of the optical element 103. Thus, a lot of light can be directed toward the rear of the surface light source 101.

In the above-described embodiments, the optical elements are of infinite-fold rotational symmetry. When an optical element is of infinite-fold rotational symmetry, uniform illumination is carried out in all directions around the optical axis in a plane perpendicular to the optical axis (rotation axis). However, it is not necessary that optical elements be of infinite-fold rotational symmetry. When the above-described conditions are satisfied in a cross section containing the optical axis and the shape is changed according to angle around the optical axis, illumination can be changed according to angle around the optical axis.

Figure 14:
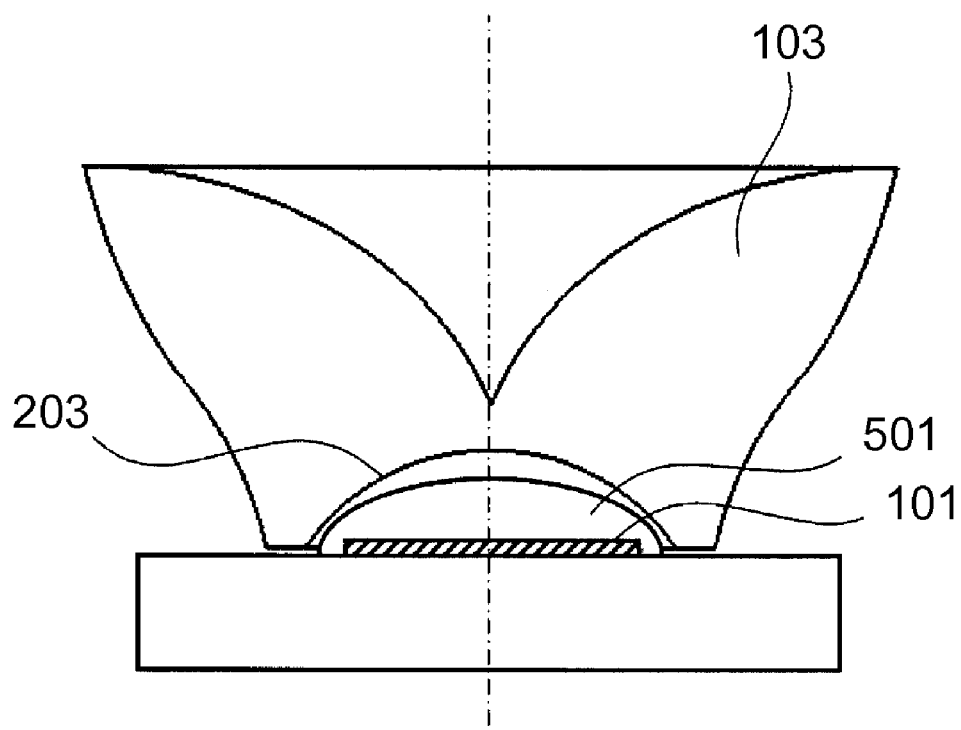
FIG. 14 shows another embodiment of an illuminating device in which a surface light source is sealed by a hemispherical transparent sealing member.

FIG. 14 shows another embodiment of an illuminating device in which a surface light source 101 is sealed by a hemispherical transparent sealing member 501. A light receiving surface 203 of an optical element 103 is bowed inward forming a hemispherical shape such that the sealing member 501 and the optical element 103 are not in contact with each other. Such a structure allows the optical element 103 to efficiently receive light from the surface light source 101 even when the surface light source 101 sealed by the sealing member 501 is used.

What is claimed is:

1. An illuminating device comprising a light source and an optical element including a light receiving surface faced to a light emitting surface of the light source, a first light exit surface located opposite to the end of the optical element from the light receiving surface and a second light exit surface connecting the light receiving surface and the first light exit surface, wherein when the center of the light emitting surface is designated as a first point, a point at the edge of the light emitting surface is designated as a second point and an axis which passes through the first point and is perpendicular to the light emitting surface is designated as an optical axis, the first light exit surface of the optical element has a hollow around the optical axis with respect to the edge and in a cross section of the optical element including the optical axis and the second point, when a point on the first exit surface at which angle of view from the first point with respect to the optical axis is 15 degrees is designated as a third point, an intersection of a ray which has been emitted at the second point and travels in parallel to the optical axis and the first light exit surface is designated as a fourth point, the first point is designated as the origin and an axis connecting the first point and the second point is designated as x axis, the first light exit surface is formed in such a way that x coordinate of a point which is the most distant from the optical axis on the first light exit surface is 1.5 times or more than x coordinate of the second point, that in 80% or more of an area in which x coordinate of a point is equal to or greater than x coordinate of the third point, an angle of incidence of light emitted at the first point is equal to or greater than the critical angle and that in 80% or more of an area in which x coordinate of a point is equal to or smaller than x coordinate of the fourth point, an angle of incidence of light emitted at the second point is smaller than the critical angle.

2. An illuminating device according to claim 1, wherein in the cross section of the optical element including the optical axis and the second point, when an axis connecting the first point and the second point is designated as x axis, the first light exit surface is formed in such a way that all of light emitted at the first point undergoes total internal reflection in an area in which x coordinate of a point is equal to or greater than x coordinate of the third point.

3. An illuminating device according to claim 1, wherein in the cross section of the optical element including the optical axis and the second point, when an axis connecting the first point and the second point is designated as x axis, an area between the third point and the fourth point in x axis direction of the first light exit surface is formed in such a way that all of light emitted at the second point undergoes refraction.

4. An illuminating device according to claim 1, wherein in the cross section of the optical element including the optical axis and the second point, when an axis connecting the first point and the second point is designated as x axis, an area between the third point and the fourth point in x axis direction of the first light exit surface is on the other side of a straight line connecting the third point and the fourth point from the light source.

5. An illuminating device according to claim 1, wherein when an area of the light emitting surface is designated A and an area of the first light exit surface is designated as B, the following condition is satisfied $$3 \leq B/A \leq 60 \quad (6).$$

6. An illuminating device according to claim 1, wherein when an area of the light emitting surface is designated A and a projected area of the first light exit surface onto a plane of the light source is designated as C, the following condition is satisfied.

$$1 \leq C/A \leq 20 \quad (7).$$

7. An illuminating device according to claim 1, wherein when an area of the light emitting surface is designated A and a height of the optical element is designated as D, the following condition is satisfied.

$$1 \leq D/\sqrt{A/\pi} \leq 10 \quad (8).$$

8. An illuminating device according to claim 1, wherein when an area of the light emitting surface is designated A and a depth of the hollow on the first light exit surface is designated as E, the following condition is satisfied.

$$0.25 \leq E/\sqrt{A/\pi} \leq 4 \quad (9).$$

9. An illuminating device according to claim 1, wherein the light emitting surface and the light receiving surface are separated by an amount of clearance.

10. An illuminating device according to claim 1, wherein at least a portion of the first light exit surface and the second light exit surface is provided with microscopic asperities.

11. An illuminating device according to claim 1, wherein in the cross section of the optical element including the optical axis and the second point, the second light exit surface has a straight-line segment.

12. An illuminating device according to claim 1, wherein the optical element is of infinite-fold rotational symmetry around the optical axis.

13. An illuminating device according to claim 12, wherein a sector of 180° or less which is cut from the shape of rotational symmetry around the optical axis is utilized.

14. An illuminating device according to claim 13, wherein cutting surfaces of the sector from the shape are curved surfaces.

15. An illuminating device according to claim 1, wherein a shape of a cross section of the optical element perpendicular to the optical axis is not uniform in circumferential direction so as to carry out non-uniform illumination in circumferential directions around the optical axis.

16. An illuminating device comprising a light source and an optical element including a light receiving surface faced to a light emitting surface of the light source, a first light exit surface located opposite to the end of the optical element from the light receiving surface and a second light exit surface connecting the light receiving surface and the first light exit surface, wherein when the center of the light emitting surface is designated as a first point, a point at the edge of the light emitting surface is designated as a second point and an axis which passes through the first point and is perpendicular to the light emitting surface is designated as an optical axis, the first light exit surface of the optical element has a hollow around the optical axis with respect to the edge and in a cross section of the optical element including the optical axis and the second point, in an area at which angle of view from the first point with respect to the optical axis is from 25 degrees to 60 degrees, the first light exit surface has an area inclination of which is equal to or less than 20 degrees with respect to a straight line connecting the first point and the second point and when a point on the first exit surface at which angle of view from the first point with respect to the optical axis is 15 degrees is designated as a third point, an intersection of a ray which has been emitted at the second point and travels in parallel to the optical axis and the first light exit surface is designated as a fourth point, angle of incidence to the first light exit surface of a ray which has been emitted at the first point and reaches the third point is designated as $\theta_{13}$, angle of incidence to the first light exit surface of a ray which has been emitted at the second point and reaches the third point is designated as $\theta_{23}$, angle of incidence to the first light exit surface of a ray which has been emitted at the first point and reaches the fourth point is designated as $\theta_{14}$, angle of incidence to the first light exit surface of a ray which has been emitted at the second point and reaches the fourth point is designated as $\theta_{24}$, and the critical angle is designated as $\theta_c$, the following conditions are satisfied.

$$15° \leq \theta_{13} - \theta_{23} \leq 70° \quad (1)$$

$$15° \leq \theta_{14} - \theta_{24} \leq 65° \quad (2)$$

$$0.2 \leq (\theta_{14} - \theta_{24})/(\theta_{13} - \theta_{23}) \leq 1 \quad (3).$$

17. An illuminating device according to claim 16, wherein the following conditions are further satisfied $$\theta_c \leq \theta_{13} \quad (4)$$

$$\theta_{23} \leq \theta_c \quad (5).$$

18. An illuminating device comprising a light source and an optical element including a light receiving surface faced to a light emitting surface of the light source, a first light exit surface located opposite to the end of the optical element from the light receiving surface and a second light exit surface connecting the light receiving surface and the first light exit surface, wherein some of rays emitted in directions deviated from the direction perpendicular to the light emitting surface are led by total internal reflection on an area close to the light receiving surface of the second light exit surface in such a way that a virtual light emitting surface is formed in the optical element, a distance of which from the light emitting surface is H and which has a shape which is identical with that formed by projecting the light emitting surface onto a plane parallel to the light emitting surface and when an area of the light emitting surface is designated as A, H should be determined such that the following condition is satisfied and that rays at an angle of view of 15 degrees with respect to the optical axis passing thorough the center of the virtual light emitting surface exist, $$2 \leq H\sqrt{A/\pi} \leq 15 \quad (12)$$

and wherein when the center of the virtual light emitting surface is designated as a first point, a point at the edge of the virtual light emitting surface is designated as a second point and an axis which passes through the first point and is perpendicular to the light emitting surface is designated as an optical axis, the first light exit surface of the optical element has a hollow around the optical axis with respect to the edge and in a cross section of the optical element including the optical axis and the second point, when a point on the first exit surface at which angle of view from the first point with respect to the optical axis is 15 degrees is designated as a third point, an intersection of a ray which has been emitted at the second point and travels in parallel to the optical axis and the first light exit surface is designated as a fourth point, the first point is designated as the origin and an axis connecting the first point and the second point is designated as x axis, the first light exit surface is formed in such a way that x coordinate of a point which is the most distant from the optical axis on the first light exit surface is 1.5 times or more than x coordinate of the second point, that in 80% or more of an area in which x coordinate of a point is equal to or greater than x coordinate of the third point, an angle of incidence of light emitted at the first point is equal to or greater than the critical angle and that in 80% or more of an area in which x coordinate of a point is equal to or smaller than x coordinate of the fourth point, an angle of incidence of light emitted at the second point is smaller than the critical angle.

19. An illuminating device comprising a light source and an optical element including a light receiving surface faced to a light emitting surface of the light source, a first light exit surface located opposite to the end of the optical element from the light receiving surface and a second light exit surface connecting the light receiving surface and the first light exit surface, wherein some of rays emitted in directions deviated from the direction perpendicular to the light emitting surface are led by total internal reflection on an area close to the light receiving surface of the second light exit surface in such a way that a virtual light emitting surface is formed in the optical element, a distance of which from the light emitting surface is H and which has a shape which is identical with that formed by projecting the light emitting surface onto a plane parallel to the light emitting surface and when an area of the light emitting surface is designated as A, H should be determined such that the following condition is satisfied and that rays at an angle of view of 15 degrees with respect to the optical axis passing thorough the center of the virtual light emitting surface exist, $$2 \leq H\sqrt{A/\pi} \leq 15 \quad (12)$$

and wherein when the center of the virtual light emitting surface is designated as a first point, a point at the edge of the virtual light emitting surface is designated as a second point and an axis which passes through the first point and is perpendicular to the light emitting surface is designated as an optical axis, the first light exit surface of the optical element has a hollow around the optical axis with respect to the edge and n in a cross section of the optical element including the optical axis and the second point, in an area at which angle of view from the first point with respect to the optical axis is from 25 degrees to 60 degrees, the first light exit surface has an area inclination of which is equal to or less than 20 degrees with respect to a straight line connecting the first point and the second point and when a point on the first exit surface at which angle of view from the first point with respect to the optical axis is 15 degrees is designated as a third point, an intersection of a ray which has been emitted at the second point and travels in parallel to the optical axis and the first light exit surface is designated as a fourth point, angle of incidence to the first light exit surface of a ray which has been emitted at the first point and reaches the third point is designated as $\theta_{13}$, angle of incidence to the first light exit surface of a ray which has been emitted at the second point and reaches the third point is designated as $\theta_{23}$, angle of incidence to the first light exit surface of a ray which has been emitted at the first point and reaches the fourth point is designated as $\theta_{14}$, angle of incidence to the first light exit surface of a ray which has been emitted at the second point and reaches the fourth point is designated as $\theta_{24}$, and the critical angle is designated as $\theta_c$, the following conditions are satisfied.

$$15° \leq \theta_{13} - \theta_{23} \leq 70° \quad (1)$$

$$15° \leq \theta_{14} - \theta_{24} \leq 65° \quad (2)$$

$$0.2 \leq (\theta_{14} - \theta_{24})/(\theta_{13} - \theta_{23}) \leq 1 \quad (3).$$

* * * * *